(12) United States Patent
Bando

(10) Patent No.: US 11,757,062 B2
(45) Date of Patent: Sep. 12, 2023

(54) METHOD FOR MANUFACTURING LIGHT EMITTING DEVICE USING REINFORCEMENT MEMBER

(71) Applicant: NICHIA CORPORATION, Anan (JP)

(72) Inventor: Yoichi Bando, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/016,207

(22) Filed: Sep. 9, 2020

(65) Prior Publication Data

US 2021/0074878 A1    Mar. 11, 2021

(30) Foreign Application Priority Data

Sep. 10, 2019   (JP) .................................. 2019-164527

(51) Int. Cl.
*H01L 21/00* (2006.01)
*H01L 33/00* (2010.01)
*H01L 25/075* (2006.01)

(52) U.S. Cl.
CPC ...... *H01L 33/0095* (2013.01); *H01L 25/0753* (2013.01); *H01L 2933/005* (2013.01)

(58) Field of Classification Search
CPC ............. H01L 33/0095; H01L 25/0753; H01L 2933/005; H01L 33/486
See application file for complete search history.

(56) References Cited

U.S. PATENT DOCUMENTS

| | | | | |
|---|---|---|---|---|
| 6,469,382 B1* | 10/2002 | Hotozuka | ............. | H01L 21/561 257/730 |
| 9,039,475 B2* | 5/2015 | Takeda | ..................... | H01L 24/97 445/24 |
| 10,431,724 B2* | 10/2019 | Ikeda | ...................... | H01L 33/54 |
| 2001/0052425 A1 | 12/2001 | Andoh et al. | | |
| 2007/0178629 A1* | 8/2007 | Ogawa | .................... | H01L 24/97 257/E33.059 |
| 2008/0101072 A1* | 5/2008 | Ohta | ....................... | H01L 33/60 362/296.07 |
| 2008/0102541 A1* | 5/2008 | Kang | .................. | H01L 33/0095 438/15 |
| 2009/0014735 A1 | 1/2009 | Higashi et al. | | |

(Continued)

FOREIGN PATENT DOCUMENTS

CN    108538989 A  *  6/2018  ......... H01L 25/0753
JP       H1174295 A       3/1999

(Continued)

*Primary Examiner* — Ismail A Muse
(74) *Attorney, Agent, or Firm* — Global IP Counselors, LLP

(57) ABSTRACT

A method for manufacturing a light emitting device includes: preparing a substrate having a first region and a second region surrounding the first region; mounting a plurality of light emitting elements in the first region; mounting a reinforcement member on the second region; forming and curing a sealing member in contact with the reinforcement member and with the light emitting elements, the sealing member having a lower rigidity than the reinforcement member; and cutting the substrate, the reinforcement member, and the sealing member to separate into individual light emitting devices each including one or more of the light emitting elements.

9 Claims, 17 Drawing Sheets

(56) References Cited

U.S. PATENT DOCUMENTS

| | | | | |
|---|---|---|---|---|
| 2010/0258830 | A1* | 10/2010 | Ide | H01L 24/97 |
| | | | | 257/E33.059 |
| 2010/0320482 | A1* | 12/2010 | Tachibana | H05K 3/284 |
| | | | | 257/88 |
| 2011/0006673 | A1* | 1/2011 | Yano | H01L 33/44 |
| | | | | 313/512 |
| 2012/0161115 | A1* | 6/2012 | Yamazaki | H01L 51/5218 |
| | | | | 257/40 |
| 2012/0299026 | A1* | 11/2012 | Tachibana | H05K 3/284 |
| | | | | 257/88 |
| 2017/0110635 | A1* | 4/2017 | Ito | H01L 33/507 |
| 2017/0114226 | A1* | 4/2017 | Tasaki | C08G 77/04 |
| 2017/0154880 | A1* | 6/2017 | Ozeki | H01L 33/58 |
| 2019/0280170 | A1 | 9/2019 | Sato et al. | |
| 2019/0312187 | A1* | 10/2019 | Harada | H01L 33/505 |
| 2020/0095430 | A1* | 3/2020 | Tasaki | B29C 48/002 |
| 2021/0119087 | A1* | 4/2021 | Kim | H01L 33/46 |
| 2021/0327354 | A1* | 10/2021 | Chen | H10K 59/126 |

FOREIGN PATENT DOCUMENTS

| | | | |
|---|---|---|---|
| JP | 2001210755 | A | 8/2001 |
| JP | 2002368364 | A | 12/2002 |
| JP | 2003264442 | A | 9/2003 |
| JP | 2005294529 | A | 10/2005 |
| JP | 2007081213 | A | 3/2007 |
| JP | 2007288050 | A | 11/2007 |
| JP | 2013207225 | A | 10/2013 |
| JP | 2015076604 | A | 4/2015 |
| JP | 2019121623 | A | 7/2019 |
| JP | 2019160862 | A | 9/2019 |

\* cited by examiner

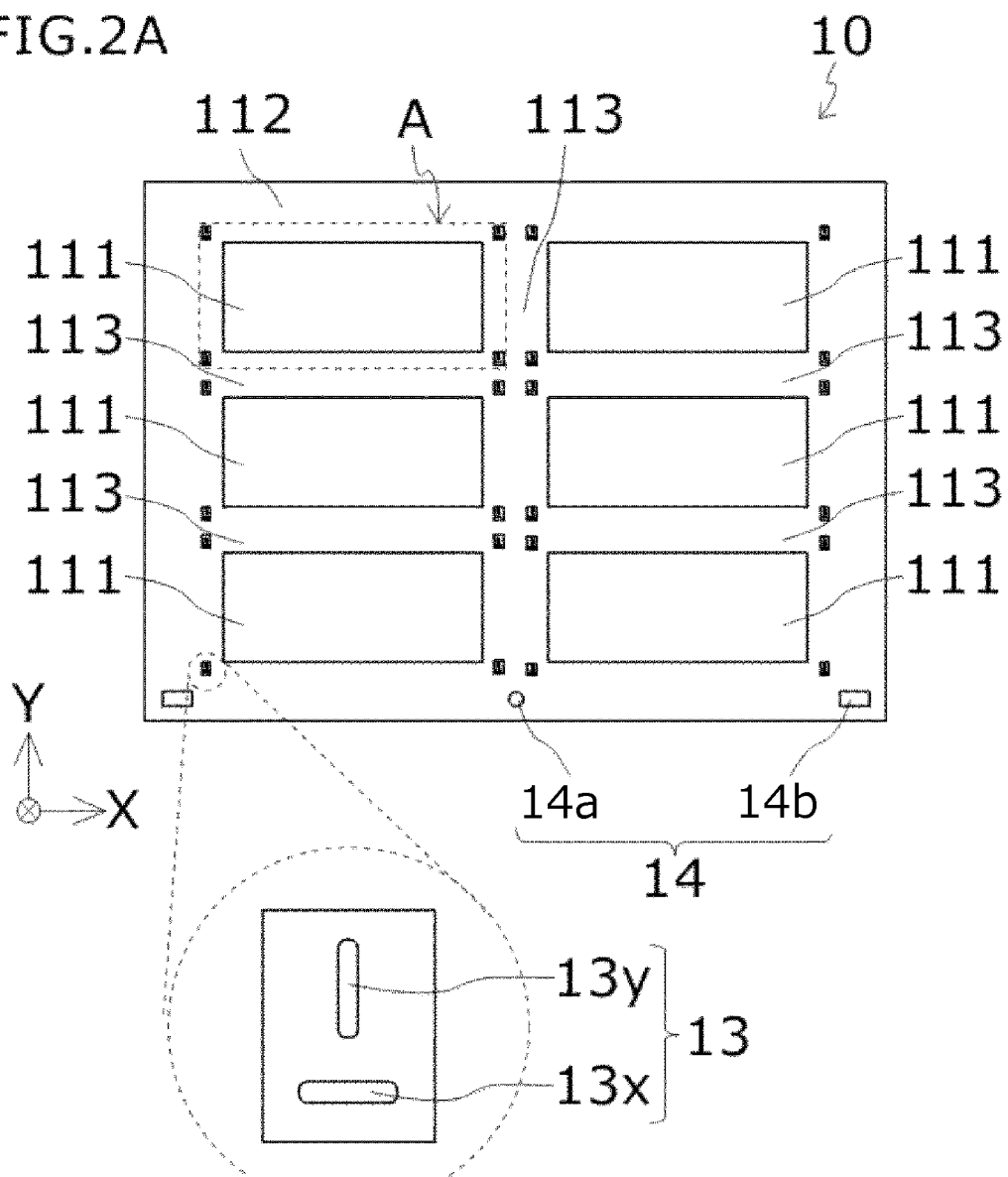

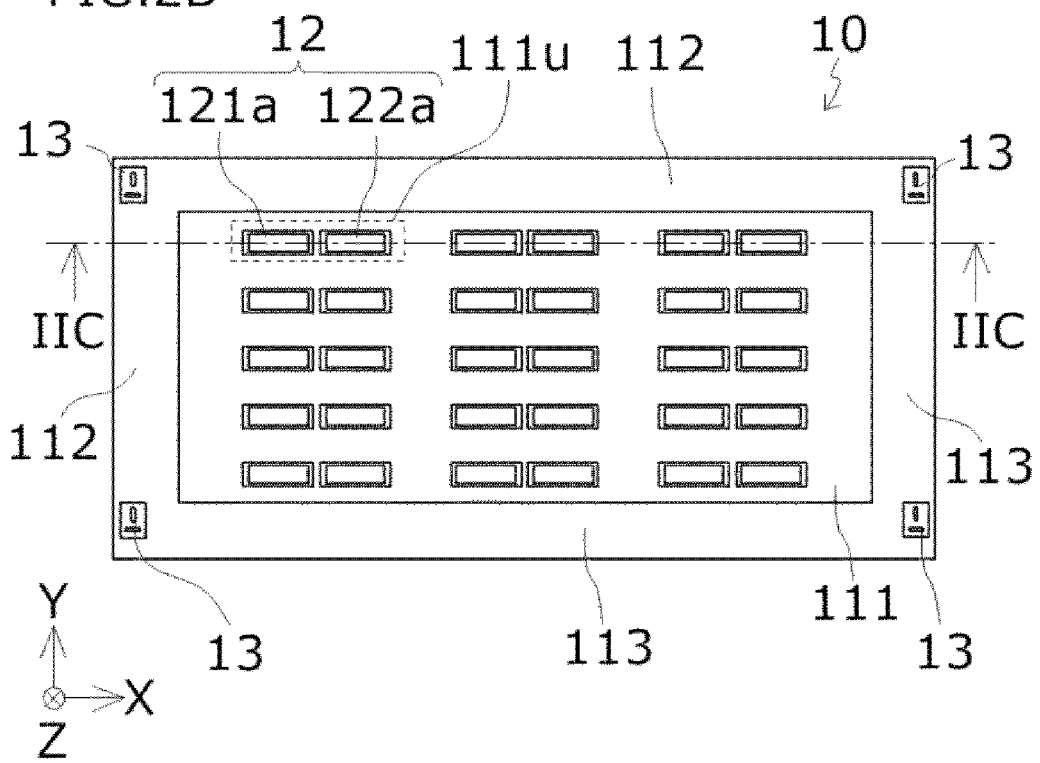
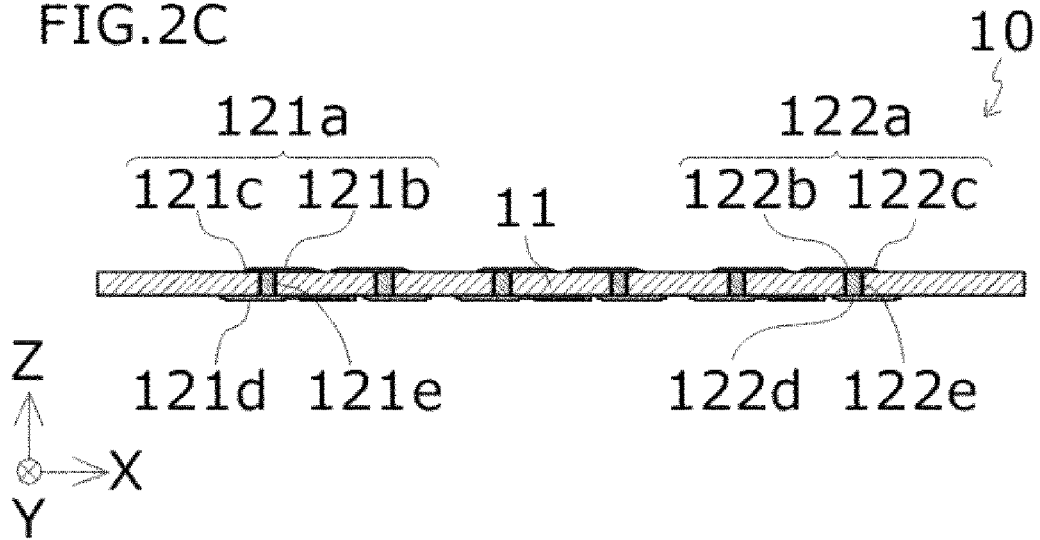

METHOD FOR MANUFACTURING LIGHT EMITTING DEVICE USING REINFORCEMENT MEMBER

CROSS-REFERENCE TO RELATED APPLICATIONS

This application claims priority to Japanese Patent Application No. 2019-164527 filed on Sep. 10, 2019. The entire disclosure of Japanese Patent Application No. 2019-164527 is hereby incorporated herein by reference.

TECHNICAL FIELD

The present disclosure relates to a method for manufacturing a light emitting device.

BACKGROUND ART

In a substrate used for manufacturing a light emitting device, joining to the substrate a plate shaped reinforcing material of higher rigidity than the substrate is known (Japanese Laid-Open Patent Publication No. 2015-76604, for example). This makes it possible to suppress warping deformation of the substrate.

SUMMARY

However, with the method noted above in which the reinforcing material is joined to the substrate, when there is a linear expansion difference in each of the materials, warping is caused by an expansion/contraction difference due to a heat change. Therefore, the options for the materials that can be used for the substrate and the reinforcing material are limited. Also, the method noted above involves extra man hours because a separate step is needed for joining the reinforcing material and the substrate.

The method for manufacturing a light emitting device of this embodiment includes the following steps.

A method for manufacturing a light emitting device according to the embodiment includes: preparing a substrate having a first region and a second region surrounding the first region; mounting a plurality of light emitting elements in the first region; mounting a reinforcement member on the second region; forming and curing a sealing member in contact with the reinforcement member and with the light emitting elements, the sealing member having a lower rigidity than the reinforcement member; and cutting the substrate, the reinforcement member, and the sealing member to separate into individual light emitting devices each including one or more of the light emitting elements.

With the method in this disclosure it is possible to provide a method for manufacturing a light emitting device with which it is possible to suppress warping of the substrate using a relatively simple method.

BRIEF DESCRIPTION OF THE DRAWINGS

FIG. 2A is a schematic plan view showing the method for manufacturing a light emitting device of the embodiment.
FIG. 2B is a schematic plan view showing an enlargement of a region A of FIG. 2A.
FIG. 2C is a schematic cross section view of line IIC-IIC of FIG. 2B.

DETAILED DESCRIPTION OF EMBODIMENTS

Figure 1A:
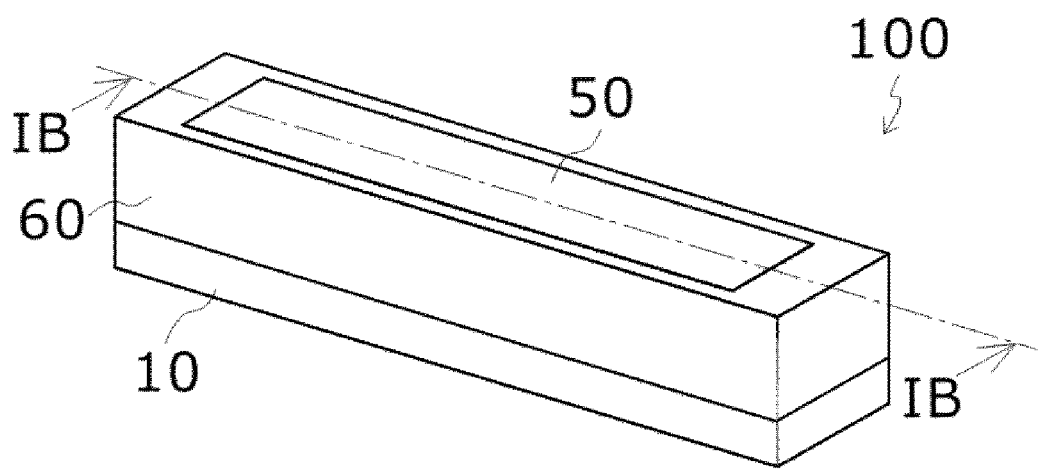
FIG. 1A is a schematic perspective view of a light emitting device manufactured using the method for manufacturing a light emitting device of an embodiment.

Following, embodiments of the invention are explained while referring to drawings as appropriate. However, the method for manufacturing a light emitting device explained hereafter is for putting the technical concept of the present invention into specific form, and unless specifically noted, the present invention is not limited to the specific structures. Also, to clarify the explanation, the size or positional relationship of members shown in the drawing may be exaggerated. Also, members such as a substrate, base, reinforcement member, light-transmissive member, sealing member, etc., use the same names before and after curing, and before and after cutting.

Figure 1B:
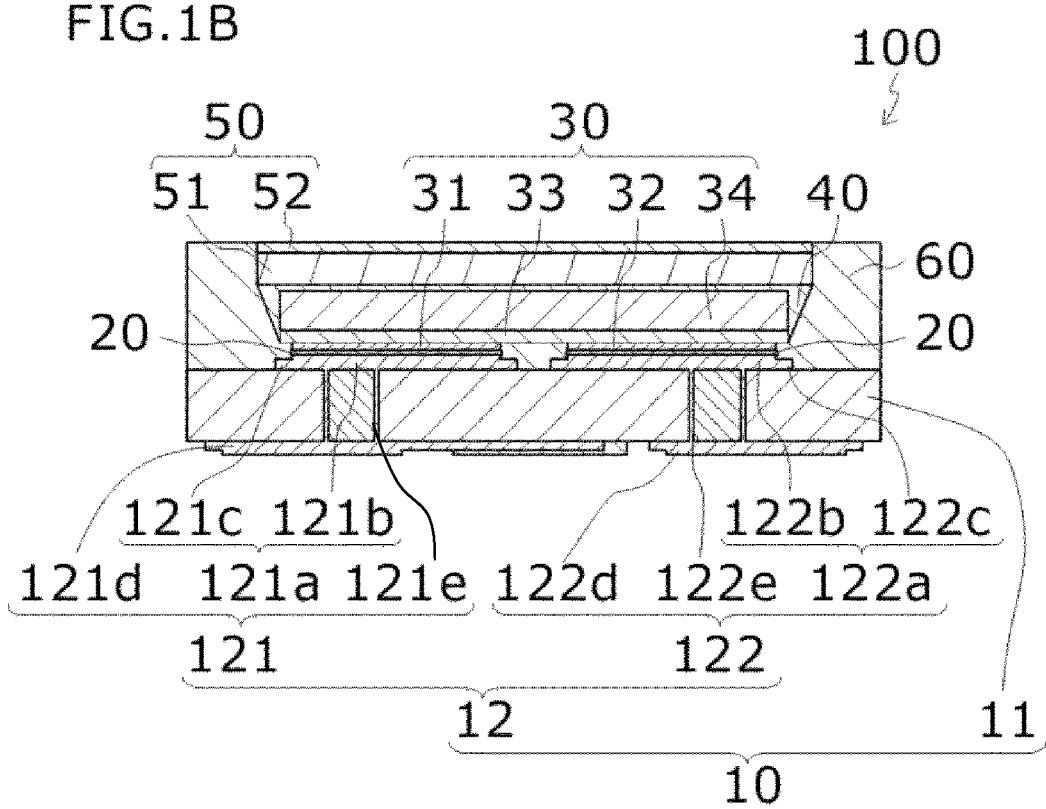
FIG. 1B is a schematic cross section view of line IB-IB of FIG. 1A.

FIG. 1A is a schematic perspective view showing an example of a light emitting device 100 obtained using a method for manufacturing a light emitting device of an embodiment, and FIG. 1B is a schematic cross section view of line IB-IB of FIG. 1A.

The light emitting device 100 includes a substrate 10, a light emitting element 30, a light-transmissive member 50, and a sealing member 60. The substrate 10 has a base 11 and an electrically conductive member 12. The electrically conductive member 12 comprises a first electrically conductive member 121 and a second electrically conductive member 122.

The first electrically conductive member 121 includes a first land electrode 121a provided on the top surface of the base 11, a first terminal electrode 121d provided on the bottom surface of the base 11, and a first connection electrode 121e. The first land electrode 121a includes a first lower electrode 121c and a first convex part 121b provided on the first lower electrode 121c. Also, the first land electrode 121a is connected to the first terminal electrode 121d by the first connection electrode 121e formed on the side surface of a through hole piercing the base 11 provided directly beneath the first land electrode 121a.

Similarly, the second electrically conductive member 122 has a second land electrode 122a provided on the top surface of the base 11, a second terminal electrode 122d provided on the bottom surface of the base 11, and a second connection electrode 122e. The second land electrode 122a includes a second lower electrode 122c and a second convex part 122b provided on the second lower electrode 122c. Also, the second land electrode 122a is connected to the second terminal electrode 122d by the second connection electrode 122e formed on the side surface of the through hole piercing the base 11 provided directly beneath the second land electrode 122a.

The first connection electrode 121e and the second connection electrode 122e are respectively provided on inner walls of the through holes of the base 11, and in the through holes, a filling material such as epoxy resin, etc., for example, is provided in each of the inside of the first connection electrode 121e and the second connection electrode 122e.

The light emitting element 30 includes, for example, an element substrate 34, and a semiconductor laminate 33 provided on one main surface of the element substrate 34. Also, the light emitting element 30 comprises a p side electrode 31 and an n side electrode 32 provided on the same side of the semiconductor laminate 33. The p side electrode 31 is connected to the first convex part 121b with an electrically conductive adhesive member 20 interposed, and the n side electrode 32 is flip-chip mounted to be connected to the second convex part 122b with the electrically conductive adhesive member 20 interposed. The p side electrode 31 contacts a p type semiconductor layer of the semiconductor laminate 33, and the n side electrode 32 contacts an n type semiconductor layer of the semiconductor laminate 33. Also, in the light emitting element 30, the surface of the element substrate 34 of the side opposite to the surface on which the p side electrode 31 and then side electrode 32 are formed is the main light emitting surface of the light emitting element 30.

The light-transmissive member 50 is a member that can transmit light from the light emitting element 30, and configures the light emitting surface of the light emitting device 100. The light-transmissive member 50 may also include a wavelength conversion substance that converts light from the light emitting element 30 to a different wavelength. Also, the light-transmissive member 50 may also be a single layer or a plurality of layers. For example, as the light-transmissive member 50, it is also possible to have a laminated structure of a first light-transmissive member 51 that contains the wavelength conversion substance in a base material comprising resin, and a second light-transmissive member 52 that substantially does not contain the wavelength conversion substance.

The sealing member 60 is a member that protects the light emitting element 30, and for example is a light reflective resin member that contains a white pigment in the base material comprising resin. The sealing member 60 covers the side surface of the light emitting element 30 on the substrate. With the light emitting device 100 shown in FIG. 1B, the sealing member 60 covers the side surface of a light guide member 40 and the light-transmissive member 50. The sealing member 60 encircles the side surface of the light emitting element 30 and the light-transmissive member 50, etc., across the entire circumference. Also, the top surface of the light-transmissive member 50 and the top surface of the sealing member 60 configure substantially the same surface (i.e., the top surface of the light-transmissive member 50 is flush with the top surface of the sealing member 60).

Hereafter, the method for manufacturing a light emitting device of an embodiment is explained while referring to drawings. The method for manufacturing a light emitting device of the embodiment is a method for manufacturing a light emitting device for which after a plurality of the light emitting devices each including a light emitting element are formed in an aggregate state, they are separated into individual light emitting devices. In more detail, the method for manufacturing a light emitting device according to the embodiment includes a substrate preparing step, an element mounting step, a reinforcement member placing step, a sealing member forming step, and a dicing step.

In the present embodiment, the substrate 10 and a reinforcement member 70 are not adhered to each other by an adhesive agent, etc., before formation of the sealing member 60. The substrate 10 and the reinforcement member 70 are placed by a positioning pin, etc., within a metal mold used for molding so that their mutual positions do not become too greatly skewed. The reinforcement member 70 placed in this way is integrally molded with the substrate 10 and the sealing member 60 during formation of the sealing member 60, and the reinforcement member 70 is adhered with the sealing member 60.

Here, the rigidity of the reinforcement member 70 is greater than the rigidity of the sealing member 60. Said another way, the rigidity of the sealing member 60 is smaller than the rigidity of the reinforcement member 70. Rigidity is the degree of difficulty in deforming with respect to bending or twisting force, and is determined by the material, thickness, and shape. The larger the value of the rigidity is, the smaller the deformation with respect to a constant load is.

Also, the linear expansion coefficient of the reinforcement member 70 is smaller than that of the sealing member 60.

The linear expansion coefficient is the degree of volume change due to temperature change, and the smaller this value of the liner expansion coefficient is, the smaller the volume change due to temperature change. In other words, when forming the sealing member 60, the deformation with respect to the constant load is small, and by curing the sealing member 60 in a state being in contact with the reinforcement member 70 with a small volume change due to heat change, it is possible to suppress the reinforcement member 70 from deforming the sealing member 60. By suppressing deformation of the sealing member 60 in this way, it is possible to manufacture the light emitting device with suppression of warping of the substrate 10 that is generated by deformation of the sealing member 60.

Hereafter, each step is explained in detail.

Substrate Preparing Step

The substrate preparing step is a step for preparing the substrate 10 that comprises the base 11, and the electrically conductive member 12 provided on the top surface, etc., of the base 11. FIG. 2A is a schematic plan view showing the overall configuration of the substrate 10 used in the method for manufacturing a light emitting device of the embodiment. FIG. 2B is a partial enlarged view of a region A enclosed by dotted lines shown in FIG. 2A, and is a drawing that includes one first region 111, a portion of a second region 112 and a portion of a third region 113 surrounding the first region 111. FIG. 2C is a schematic cross section view of line IIC-IIC of FIG. 2B.

The substrate 10, for example, has a top view shape that is a quadrangle like that shown in FIG. 2A, and comprises the first regions 111, and the second region 112 surrounding the first regions 111. Each of the first regions 111 is a region that includes a mounting region in which the light emitting elements are mounted. The second region 112 is a region in which light emitting elements are not mounted, and is a region that is not included in a diced (singulated) light emitting device.

The substrate 10 may comprise one or a plurality of first regions 111, and in FIG. 2A, an example is shown of the substrate 10 comprising six first regions 111. In this way, when a plurality of the first regions 111 are placed, the region that surrounds all the plurality of first regions 111 is the second region 112. Also, as shown in FIG. 2A, when a plurality of the first regions 111 are comprised in the region surrounded by the second region 112, the region between the first region 111 and the adjacent first region 111 (an additional first region) is called the third region 113. The third region 113, the same as the second region 112, is a region in which the reinforcement member can be placed.

The plurality of first regions 111, for example, are arranged forming one or a plurality of rows and columns. In this specification, items arranged in the X direction are called rows, and items arrayed in the Y direction are called columns. With the example shown in FIG. 2A, six first regions 111 are placed in 3 rows×2 columns. Also, each of the first regions 111 include a plurality of unit mounting regions 111u provided corresponding to one light emitting device 100. With the example shown in FIG. 2B, one unit mounting region 111u is illustrated as a horizontally long rectangle, and a plurality of unit mounting regions 111u are arrayed in a plurality of rows and columns in each first region 111. For example, in one first region 111 it is possible to comprise 40 rows×24 columns of the unit mounting regions 111u. Here, enlarged unit mounting regions 111u are illustrated in 5 rows×3 columns.

Each of the unit mounting regions 111u of the substrate 10 is provided with the first land electrode 121a and the second land electrode 122a as shown in FIG. 2B. The first land electrode 121a includes the first lower electrode 121c and the first convex part 121b provided on the first lower electrode 121c as shown in FIG. 2C. Similarly, the land electrode 122a includes the second lower electrode 122c and the second convex part 122b provided on the second lower electrode 122c.

Also, on the bottom surface of the substrate 10 in the unit mounting region 111u, the first terminal electrode 121d and the second terminal electrode 122d are provided. In each unit mounting region 111u, the first land electrode 121a is connected to the first terminal electrode 121d by the first connection electrode 121e formed on the side surface of the through hole provided in the substrate 19. Similarly, the second land electrode 122a is connected to the second terminal electrode 122d by the second connection electrode 122e formed on the side surface of the through hole provided in the substrate 10.

The substrate 10 preferably comprises alignment marks 13 used mainly for a cutting step. For the alignment marks 13, for example, as shown in FIG. 2A, it is possible to use an item that combines two alignment marks 13x, 13y. The alignment mark 13x is formed so that the long direction matches the X direction, and the alignment mark 13y is formed so that the long direction matches the Y direction. For example, the alignment mark 13x has a shape that is long in the X direction and has long sides facing extending in the X direction, and semi-circular end sides respectively connecting the ends of the long sides. Also, the alignment mark 13y has a shape that is long in the Y direction and has long sides facing extending in the Y direction, and semicircular shaped end sides connecting the ends of the long sides. The alignment marks 13 (13x, 13y), as shown in FIG. 2A, for example, has one of or both placed inside the second region 112 near the outside corner of each first region 111.

The substrate 10 preferably comprises through holes 14 used mainly as positioning holes in the sealing member forming step. When placing a reinforcement member 70 on the substrate 10, the through holes 14 are used to align the positions of the substrate and the reinforcement member 70. For the through hole 14, for example as shown in FIG. 2A, it is possible to use an item combining two types of through holes 14a, 14b with different shapes. The through hole 14a is a circular shape, for example, and is formed to be equal to the diameter of the positioning pin used in the sealing member forming step. Also, the through hole 14b is a rectangular shape, for example, and is formed so that the short direction length is equal to the diameter of the positioning pin. Either or both of the through holes 14 (14a, 14b) are placed inside the second region 112 as shown in FIG. 2A, for example.

As the substrate 10, it is possible to use the kinds of materials below. With the base 11 which is the base material of the substrate 10, the linear expansion coefficient is preferably, for example, approximately 20 ppm/° C. or less, more preferably approximately 10 ppm/° C. or less, and more preferably approximately 8 ppm/° C. or less, approximately 7 ppm/° C. or less, approximately 6 ppm/° C. or less, approximately 5 ppm/° C. or less, approximately 4 ppm/° C. or less, or approximately 3.5 ppm/° C. or less. As specific materials of the base 11, it is possible to use epoxy resin, bismaleimide triazine (BT) resin, polyimide resin, cyanate resin, polyvinyl acetal resin, phenoxy resin, acrylic resin, alkyd resin, urethane resin, etc. The thickness of the base 11 depends on the used material, the type and structure of the mounted light emitting element, etc., but for example is preferably approximately 470 µm or less, and more preferably approximately 370 µm or less, approximately 320 µm or less, and 270 µm, 200 µm, 150 µm, and approximately 100 µm or less. Also, when considering strength, etc., it is preferable that the thickness of the base 11 be approximately 20 µm or greater. The size of the base 11 can be a quadrangle with one side being 90 mm to 60 mm, for example. The size of the first region 111 can be a quadrangle with one side being 36 mm to 14 mm. The second region 112 can have a width of 75 mm to 90 mm for the frame surrounding the first region 111. The third region 113 can have a width of 50 mm to 78 mm.

Element Mounting Step

Figure 3A:
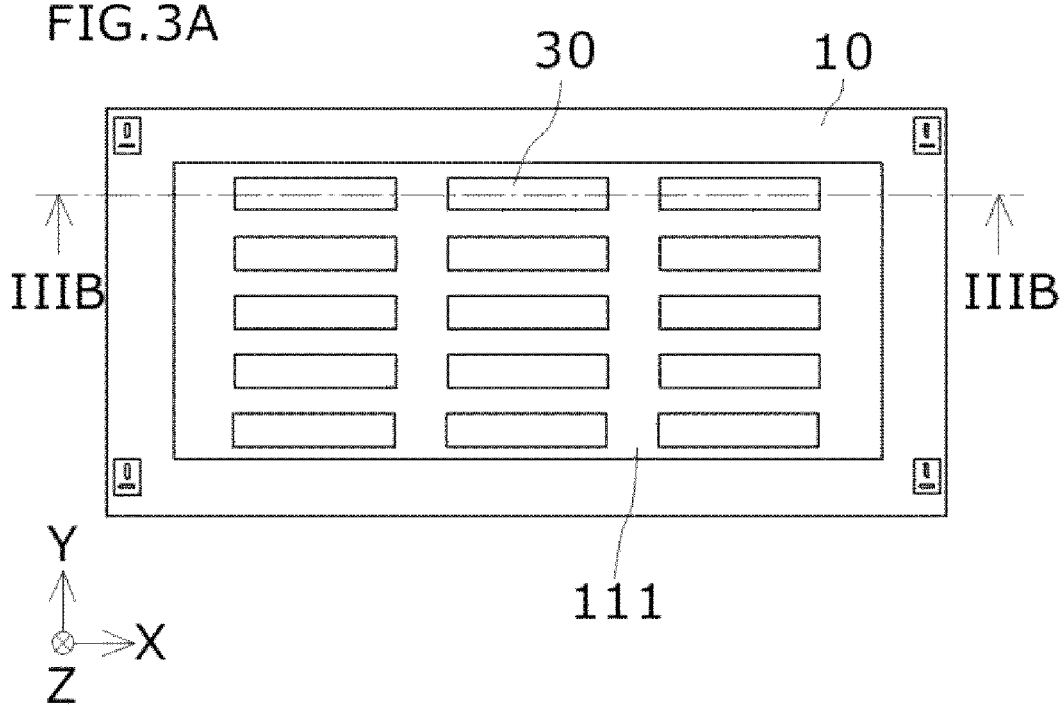
FIG. 3A is a schematic plan view showing the method for manufacturing of a light emitting device of the embodiment.
Figure 3B:
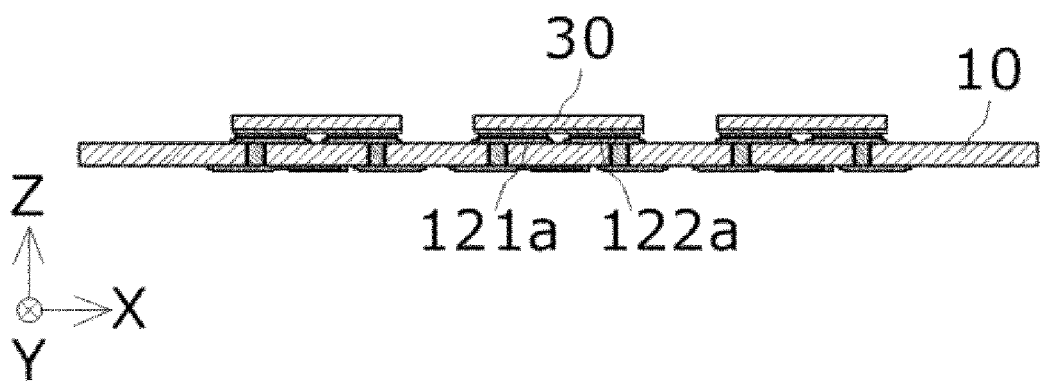
FIG. 3B is a schematic cross section view of line IIIB-IIIB of FIG. 3A.

The element mounting step is a step for mounting and joining each of the light emitting elements 30 on prescribed positions of the first region 111 on the substrate 10. With the element mounting step, as shown in FIG. 3A and FIG. 3B, one light emitting element 30 is flip-chip mounted on the first land electrode 121a and the second land electrode 122a placed in the first region 111 on the substrate 10.

For the light emitting elements 30 prepared with the element mounting step, it is possible to use known semiconductor light emitting elements. In the present embodiment, a light emitting diode is shown as an example of the light emitting element 30. The light emitting element 30 has a main light emitting surface through which the majority of emitted light is extracted, and a pair of electrodes on the electrode forming surface on the side opposite to the main light emitting surface.

The light emitting element 30 comprises, for example as shown in FIG. 1B, the light-transmissive element substrate 34 of sapphire, etc., and the semiconductor laminate 33. The semiconductor laminate 33 includes a light emitting layer, and the n type semiconductor layer and the p type semiconductor layer that sandwich the light emitting layer, and an n side electrode 32 and a p side electrode 31 are respectively electrically connected to the n type semiconductor layer and the p type semiconductor layer. The light emitting element 30, for example, has the main light emitting surface comprising the element substrate places facing a light guide plate, and has a pair of electrodes on the electrode forming surface on the side opposite to the main light emitting surface.

For the light emitting element 30, it is possible to select an element that emits light of any wavelength. For example, as an element that emits blue and green light, it is possible to use a nitride semiconductor ($In_xAl_yGa_{1-x-y}N$, $0 \leq X$, $0 \leq Y$, $X+Y \leq 1$). It is also possible to use a semiconductor light emitting element comprising materials other than these. It is possible to select various light emission wavelengths according to the material of the semiconductor layer and the mixed crystal level thereof. The composition, light emission color, size, number, etc., of the used light emitting element may be selected as appropriate according to the purpose.

The size of the light emitting element 30, for example, preferably has the vertical and horizontal dimensions in the plan view be 1000 µm or less, more preferably has the vertical and horizontal dimensions be 500 µm or less, and even more preferably has the vertical and horizontal dimensions be 200 µm or less.

Before mounting the light emitting elements 30 on the substrate 10, first, the meltable electrically conductive adhesive member 20 is placed on the first convex part 121b and on the second convex part 122b of the electrically conductive member 12 of the substrate 10. As the electrically conducive adhesive member 20, examples include a eutectic solder such as PbSn, etc., an AuSn alloy, an SnAgCu alloy, etc. The AuSn alloy can be formed in a ball shape, a hemisphere shape, etc. Also, when forming the electrically conductive adhesive member 20 in a ball shape (in the case of an AuSn alloy), to stabilize the orientation of the light emitting element mounted thereon, a temporary fixing material may be placed on the ball of AuSn alloy. As the temporary fixing material, it is preferable to use a member that is volatilized by heating, examples including a high boiling point solvent, etc. When the AuSn alloy is not in a ball shape, for example, in the case of the electrically conductive adhesive member 20 with a flat top surface, placement of the temporary fixing material can be omitted.

Next, the light emitting elements 30 are mounted on the substrate 10 such that the p side electrode 31 and the n side electrode 32 of the light emitting element 30 respectively oppose the first convex part 121b and the second convex part 122b. Also, the substrate 10 on which the light emitting elements 30 are mounted is placed inside a heating device such as a reflow oven, etc., and after melting the electrically conductive adhesive member 20 by heating, this is cooled and cured. The heating temperature is a temperature higher than the melting point of the electrically conductive adhesive member 20, and can be approximately 290 to 330° C., for example. When this heat melting is done, by a self alignment effect by the first convex part 121b and the second convex part 122b, the light emitting elements 30 are mounted with high positional accuracy.

Light-Transmissive Member Placing Step

The light-transmissive member placing step is a step for placing the light-transmissive member 50 on the light emitting element 30. Here, as a method for placing the light-transmissive member 50, explained as an example is a method for mounting the light-transmissive member 50 molded in advance on the light emitting element 30.

Figure 4A:
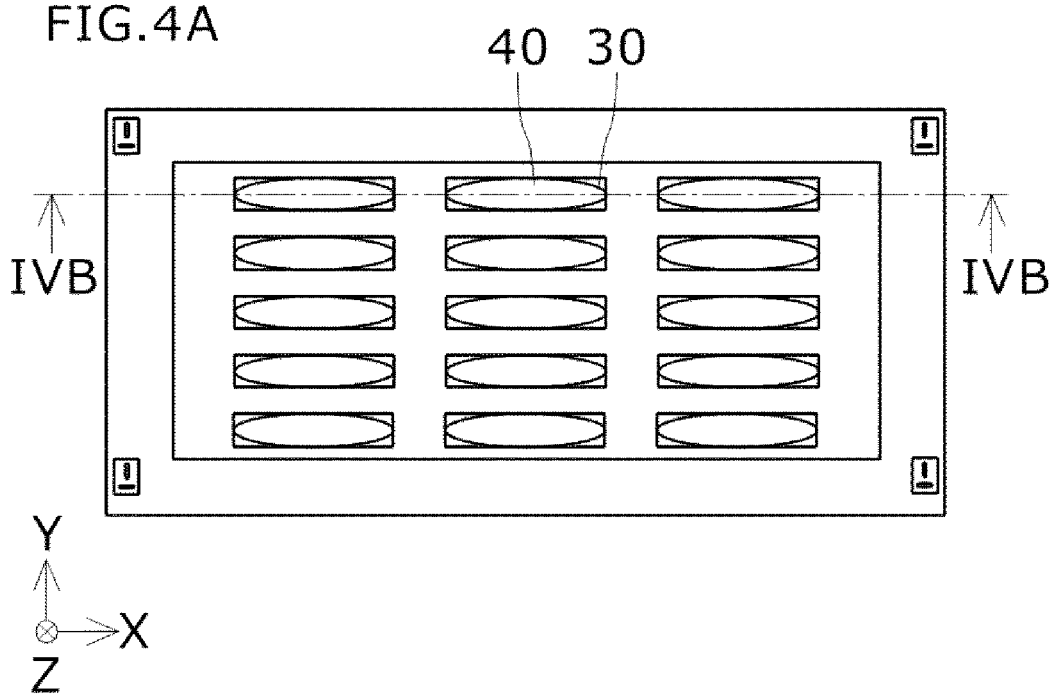
FIG. 4A is a schematic plan view showing the method for manufacturing a light emitting device of the embodiment.
Figure 4B:
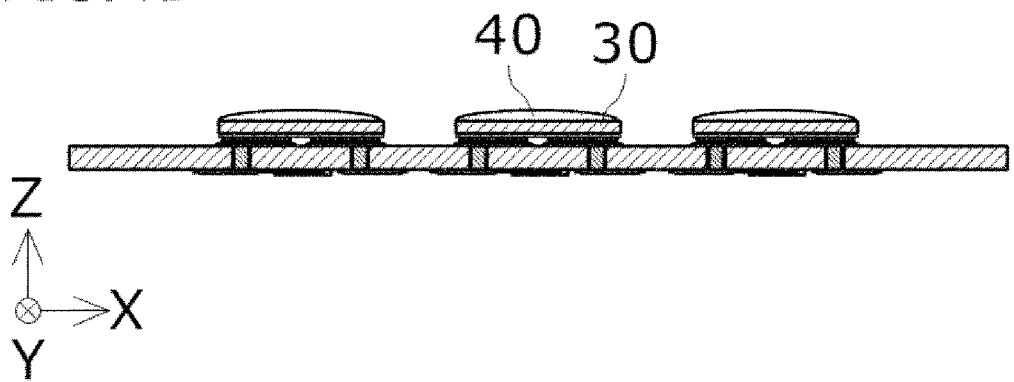
FIG. 4B is a schematic cross section view of line IVB-IVB of FIG. 4A.
Figure 5A:
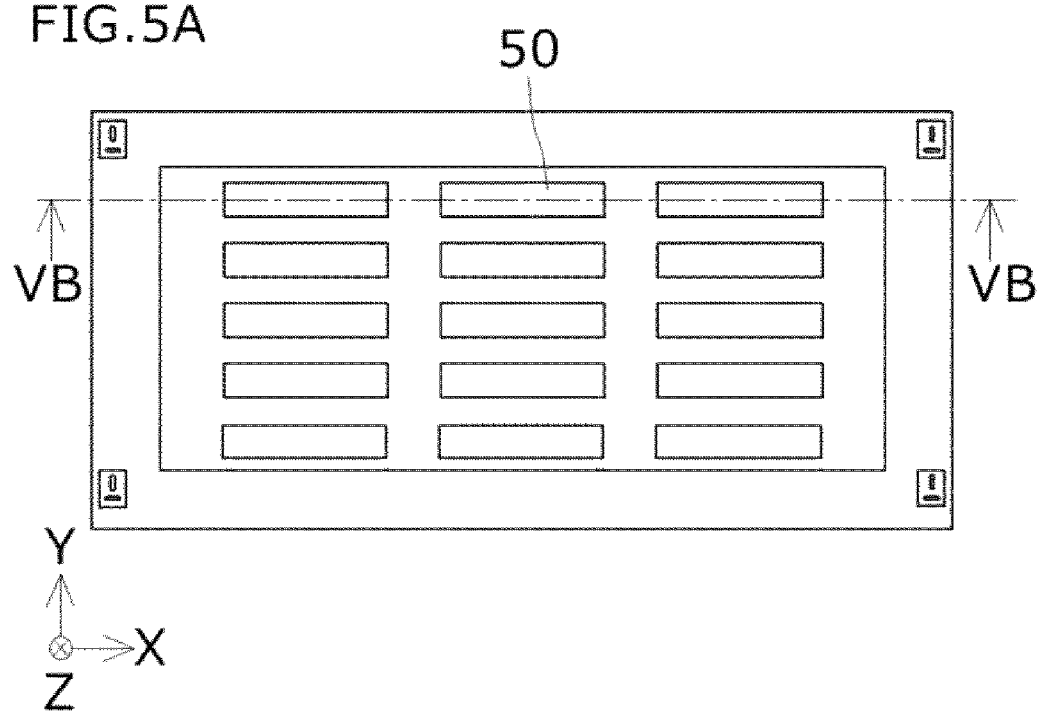
FIG. 5A is a schematic plan view showing the method of manufacturing a light emitting device of the embodiment.
Figure 5B:
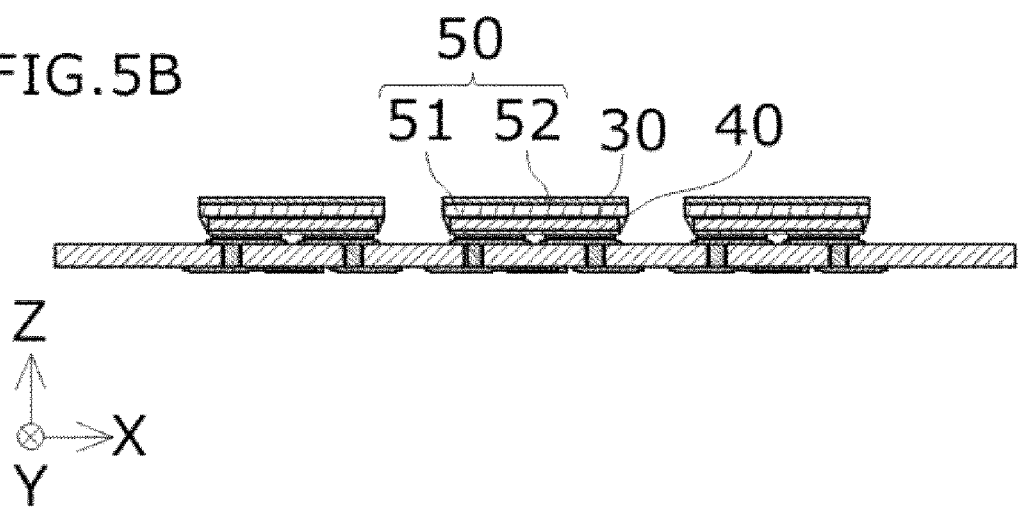
FIG. 5B is a schematic cross section view of line VB-VB of FIG. 5A.

First, as shown in FIG. 4A and FIG. 4B, the liquid light guide member 40 that becomes the adhesive agent is placed on the light emitting element 30. Subsequently, as shown in FIG. 5A and FIG. 5B, after mounting the light-transmissive member 50 on the light guide member 40, the light guide member 40 is cured by heating. As the method for placing the light guide member 40, examples include a method of transferring using a pin, a method of potting using a dispenser, etc. The "liquid" in this specification includes sols and slurries.

The light-transmissive member 50 molded in advance is a small cuboid piece that is long in the X direction and short in the Y direction, and for example, is one size larger than the light emitting element 30 in the plan view. The small piece light-transmissive member 50 can be obtained, for example, by cutting a large light-transmissive member, or alternatively, it is possible to form the small piece light-transmissive member 50 in advance. The formed light-transmissive member 50 is picked up by suction using a collet, etc., and after mounting on the light guide member 40 on the light emitting surface of the light emitting element 30, joining is done by curing the light guide member 40. The method for curing the light guide member 40 includes heating or ultraviolet irradiation.

The light-transmissive member 50 may comprise a single layer or a plurality of layers. For example, the light-transmissive member 50 can have a laminated structure in which are laminated two or more of a layer containing the wavelength conversion substance, and a layer that substantially does not contain the wavelength conversion substance.

When the light-transmissive member 50 has a laminated structure, as shown in FIG. 1B, FIG. 5B, etc., it is preferable to have a laminated structure in which are laminated the first light-transmissive member 51 containing the wavelength conversion substance on the bottom side, and the second light-transmissive member 52 that substantially does not contain the wavelength conversion substance. By doing this, for example, in the sealing member forming step described later, when removing the sealing member on the light-transmissive member 50 using grinding, etc., it is possible to remove the sealing member without grinding to the layer containing the wavelength conversion substance. This makes it possible to have little variation in the amount of wavelength conversion substance existing on the light emitting element 30, and possible to have little variation in the light emitting color of the light emitting device. When the wavelength conversion substance is contained, it is possible to mix the wavelength conversion substance at 80 weight % to 120 weight % with respect to 100 weight % of resin which is the base material, for example. The first light-transmissive member 51 that contains the wavelength conversion substance may contain one type of wavelength conversion substance, or may contain two or more types of wavelength conversion substance of different compositions. Also, the first light-transmissive member 51 may have a laminated structure, for example, it may have a laminated structure for which the bottom layer is a phosphor that can emit green light, and the top layer is a phosphor that can emit red light, etc.

As the wavelength conversion substance, for example, as the phosphor that emits green light, examples include yttrium aluminum garnet type phosphor (e.g. $Y_3(Al, Ga)_5O_{12}$: Ce), lutetium aluminum garnet type phosphor (e.g. $Lu_3(Al, Ga)_5O_{12}$: Ce), terbium aluminum garnet type phosphor (e.g. $Tb_3(Al, Ga)_5O_{12}$: Ce), silicate type phosphor (e.g. $Ba, Sr)_2SiO_4$: Eu), chlorosilicate type phosphor (e.g. $Ca_8Mg(SiO_4)_4Cl_2$: Eu), β sialon type phosphor (e.g. $Si_{6-z}Al_zO_zN_{8-z}$: Eu ($0<z<4.2$)), SGS type phosphor (e.g. $SrGa_2S_4$: Eu), etc. As a phosphor that emits yellow light, examples include a sialon type phosphor (e.g. $M_z(Si, Al)_{12}(O, N)_{16}$ (however, $0<z\leq2$, and M is Li, Mg, Ca, Y, and a lanthanide element excluding La and Ce). In addition, there are also phosphors that emit yellow light among the abovementioned phosphors that emit green light. Also, for example, with the yttrium aluminum garnet type phosphors, by substituting a portion of the Y with Gd, it is possible to shift the light emitting peak wavelength to the long wavelength side, and possible to emit yellow light. Also, among these, there are also phosphors that can emit orange light.

As phosphors that emit red light, examples include nitrogen-containing calcium aluminosilicate (CASN or SCASN) type phosphor (e.g. $(Sr, Ca)AlSiN_3$: Eu), etc. In addition, examples include manganese-activated fluoride phosphor (phosphors represented by general formula (I) $(A_2[M_{1-a}Mn_aF_6]$ (however, in the abovementioned general formula (I), A is at least one type selected from a group comprising K, Li, Na, Rb, Cs, and $NH_4$, M is an element of at least one type selected from the group comprising Group 4 elements and Group 14 elements, and a satisfies $0<a<0.2$)). As a representative example of this manganese-activated fluoride phosphor, there is a phosphor of manganese activated potassium fluorosilicate (e.g. $K_2SiF_6$: Mn).

After adhering each light-transmissive member 50 formed in advance on the light emitting element 30, a machining step for adjusting the outline of the light-transmissive member 50 to a prescribed size may be included. This machining step, using a dicer, for example, preferably grinds the side surface of the light-transmissive member 50 using dry grinding without spraying water. By using dry grinding, it is possible to prevent color change of the wavelength conversion substance due to moisture. Also, with this machining step, it is possible to implement positioning of the blade for grinding using alignment marks 3x, 3y with good precision. Also, for cleaning of shavings after machining, by cleaning using dry ice, for example, it is possible to prevent color change of the wavelength conversion substance due to moisture.

For the light-transmissive member 50, in addition to using the kind of light-transmissive member 50 formed in advance as described above, it is also possible to form a liquid light-transmissive member 50 on the light emitting element 30 using a potting method or spray method and cure that. In that case, it is possible to omit placing of the light guide member 40. Also, when forming the light-transmissive member 50 using the potting method or the spray method, after forming the sealing member 60 described later such that the top surface of the light emitting element 30 is exposed, after exposing the top surface of the light emitting element 30 using grinding, etc., the light-transmissive member 50 is formed using the potting method or the spray method.

Reinforcement Member Placing Step

Next, the reinforcement member is placed on the second region 112 of the substrate 10. The reinforcement member is only mounted on the substrate 10, without pasting to the substrate 10 using the adhesive agent, etc. However, for positioning, it is preferable to arrange so that the position of the substrate 10 and the reinforcement member 70 are not greatly skewed, using pins, screws, a jig for fixing, etc.

The reinforcement member is placed on the second region 112 and/or on the third region 113 of the substrate 10. The reinforcement member is not placed on the first region 111 of the substrate 10.

The reinforcement member is preferably placed at a position of the second region 112 closer to the first region 111, and for example, it is preferable that the distance from the end part of the first region 111 to the end part of the reinforcement member 70 is 5 mm or less.

The size of the reinforcement member is preferably the same or smaller than the size of the substrate 10. Furthermore, one or a plurality of reinforcement members can be placed on one substrate 10. One reinforcement member is preferably formed at a length of at least 60% or greater than the length of at least one first region 111 in the X direction or the Y direction, and more preferably, is formed at a length of at least 100% or greater than the length of one first region 111.

Also, the reinforcement member may be placed on the entire region of the second region 112 that surrounds the first region 111, or can be placed on a portion of the second region 112. When the substrate 10 comprises a plurality of first regions 111, and comprises a third region 113 between the first regions 111, it is possible to place the reinforcement member 70 on the third region 113. In this case, the reinforcement member may be placed only on the second region 112, or only on the third region 113, or the reinforcement member may be placed on both the second region 112 and on the third region 113.

Also, the thickness of the reinforcement member is preferably a thickness that is higher than the top surface of the light emitting element 30. Furthermore, when the light-transmissive member 50 is placed on the light emitting element 30 in the step described later, it is preferable that the thickness be higher than the top surface of the light-transmissive member 50. For example, it is preferable that the thickness of the reinforcement member be a thickness of 100 µm to 500 µm.

Also, it is acceptable for the thickness of the reinforcement member to not all be the same. In other words, it is possible to comprise a part for which the height of the top surface of the reinforcement member differs. Alternatively, a part may be comprised for which the bottom surface of the reinforcement member is not in contact with the substrate 10. Said another way, a portion of the reinforcement member may have the top surface and/or the bottom surface be in contact with the sealing member. For example, when comprising a first reinforcement member for which the reinforcement member is the outer frame and a second reinforcement member that is the inner frame, by making the thickness of the second reinforcement member thinner than that of the first reinforcement member, it is possible to form the sealing member so as to contact the top surface and the bottom surface of the second reinforcement member.

The cross section view shape of the reinforcement member can be a shape for which the top surface is a flat quadrangle, for example. However, the invention is not limited to this, and the cross section view shape of the reinforcement member may be a shape such as semicircular, semielliptical, or a parabolic curve, or may be a shape for which the top surface is a concave surface, a shape for which the top surface is a convex curved surface for which the side surface is approximately perpendicular, or a shape such as a trapezoid, etc.

Also, the width of the reinforcement member (width of the first reinforcement member, or width of the second reinforcement member) can be 1 mm to 5 mm, for example.

The material of the reinforcement member is preferably a material for which the rigidity is greater than the rigidity of the sealing member 60 after curing. Also, the material of the reinforcement member preferably has a higher rigidity than the substrate 10. Furthermore, it is preferable that a material that is excellent in preventing warp deformation is used as the material of the reinforcement member. Examples of the material of the reinforcement member include metal, polymer composite material, a thin metal bonding agent, etc. More specifically, examples of metal include copper, stainless steel, etc. Furthermore, examples of the polymer composite material include silicone resin, modified silicone resin, hybrid silicone resin, epoxy resin, glass epoxy, bismaleimide triazine (BT), polyimide, etc. These can be used alone or in combination of two or more. For example, it is possible to use an item with a metal plate and the polymer composite material pasted together.

Also, when the reinforcement member is a polymer composite material, as the composite material, a filler may also be contained. As the filler, it is possible to include at least one item selected from alumina, silica, titania, and aluminoborosilicate glass. The blending amount of the filler can be 1 weight % or greater and 80 weight % or less with respect to the resin which is the base material, for example.

Figure 6A:
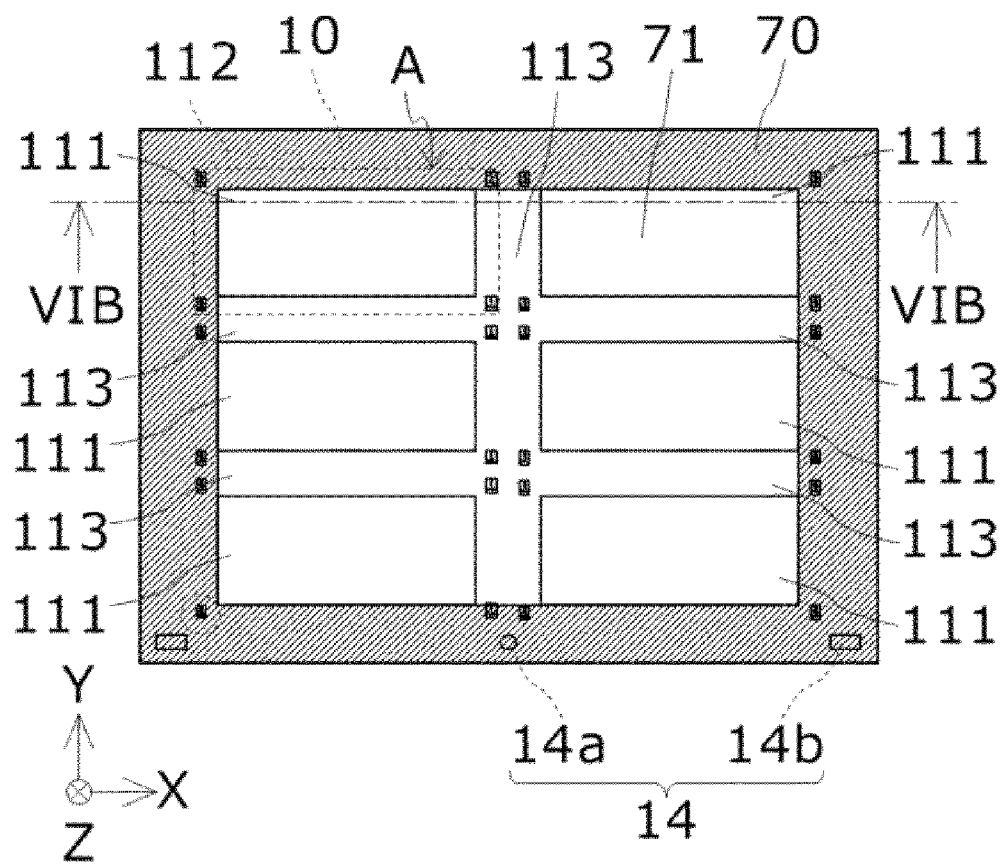
FIG. 6A is a schematic plan view showing the method of manufacturing a light emitting device of the embodiment.
Figure 6B:
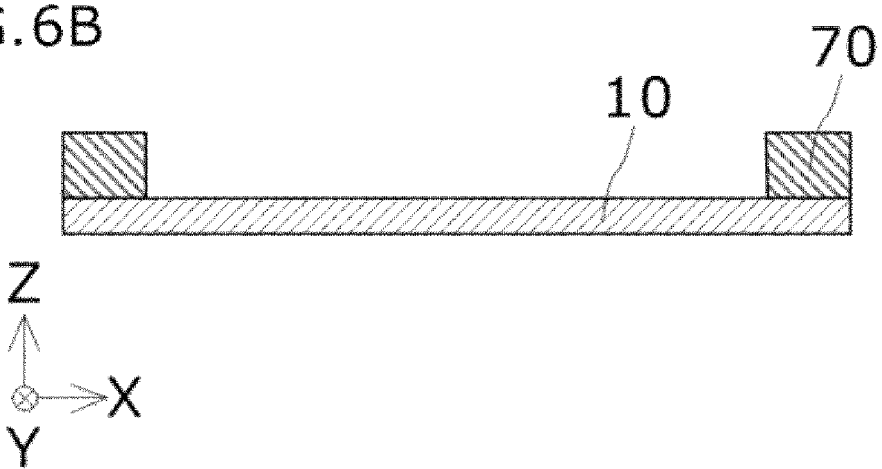
FIG. 6B is a schematic cross section view of line VIB-VIB of FIG. 6A.

The example shown in FIG. 6A and FIG. 6B show the overall substrate 10 that includes six first regions 111 shown in FIG. 2A and FIG. 2B, and the reinforcement member 70 placed thereon. Here, illustration is omitted of members mounted on the substrate 10, such as the light emitting elements, etc. In FIG. 7A to FIG. 10B as well, illustration of the light emitting element, etc., is omitted.

With the example shown in FIG. 6A and FIG. 6B, the reinforcement member 70 comprises an opening 71 to expose the first region 111 on the substrate 10. The reinforcement member 70 is a frame shape surrounding the opening 71, and is placed only on the second region 112 of the substrate 10. The reinforcement member 70 is not placed on the third region 113 between the first regions 111. In this way, by placing the reinforcement member 70 only on the second region 112, using a forming method such as potting or transfer molding that requires flowing of the sealing member 60, it is possible to suppress warping without obstructing forming of the sealing member 60.

With the example shown in FIG. 6A and FIG. 6B, the substrate 10 comprises a plurality of first regions 111, and the reinforcement member 70 is placed only on the second region 112 that surrounds all of the first regions 111. Here, illustrated is an example of one frame shaped reinforcement member 70 being placed on the frame shaped second region 112. By comprising the frame shaped reinforcement member 70 that is continuous with the periphery of the first region 111, it is possible to suppress warping of the substrate.

It is also possible for the reinforcement member to not be one frame shaped member. Specifically, it is also possible to use one or a plurality of reinforcement members of shapes such as a straight line, an L shape, a T shape, or a squared U shape, and to place those at a portion of the periphery of the first region 111, or surrounding the periphery. When using a plurality of reinforcement members, the reinforcement members may be in contact with each other or may not be in contact with each other.

Also, it is preferable that the reinforcement member or the reinforcement members be placed at a position or positions that are linearly symmetrical in a plan view of the substrate 10. This makes it possible to efficiently suppress warping of the substrate 10.

Figure 7A:
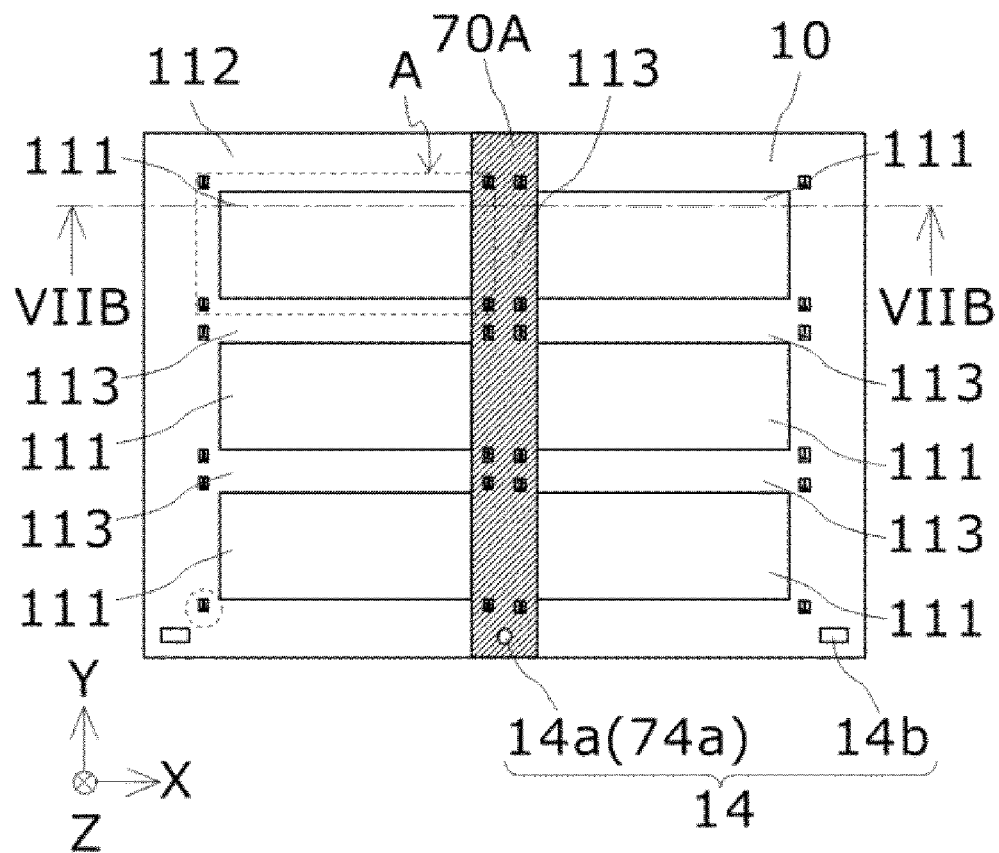
FIG. 7A is a schematic plan view showing the method for manufacturing a light emitting device of the embodiment.
Figure 7B:
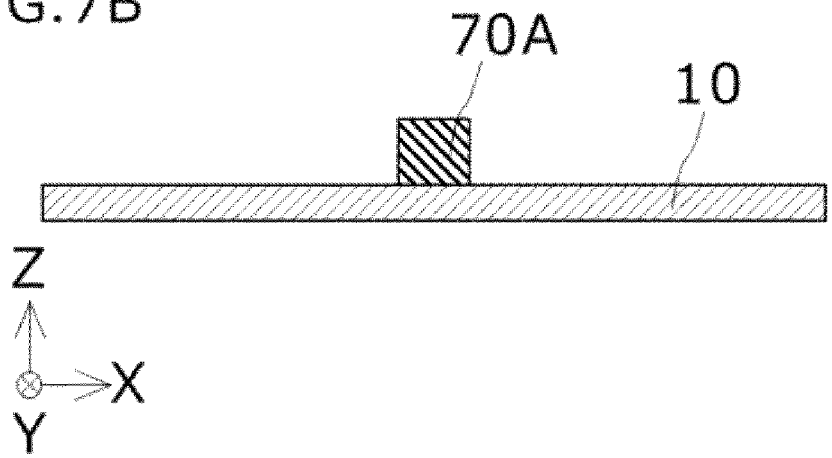
FIG. 7B is a schematic cross section view of line VIIB-VIIB of FIG. 7A.

With another example shown in FIG. 7A and FIG. 7B, a reinforcement member 70A is placed at a portion of the third region 113 adjacent to the first region 111 an a portion of the second region 112 rather than surrounding the entire periphery of the first region 111. In more detail, a straight line-shape reinforcement member 70A is placed between the first regions 111 placed side by side in the X direction. In this way, even with the reinforcement member 70A that does not surround the first region 111, it is possible to suppress warping of the substrate 10 after sealing member molding. This kind of reinforcement member 70A that is placed on the third region 113 and on a portion of the second region 112 placed on an extension of the third rection 113 is preferably placed at the center of the substrate 10. This makes it possible to efficiently suppress warping of the center part of the substrate 10. This kind of reinforcement member 70A that is mainly placed on the third region 113 can be various shapes other than the straight line shown in FIG. 7A, such as an L shape, a T shape, a squared U shape, etc.

Figure 8A:
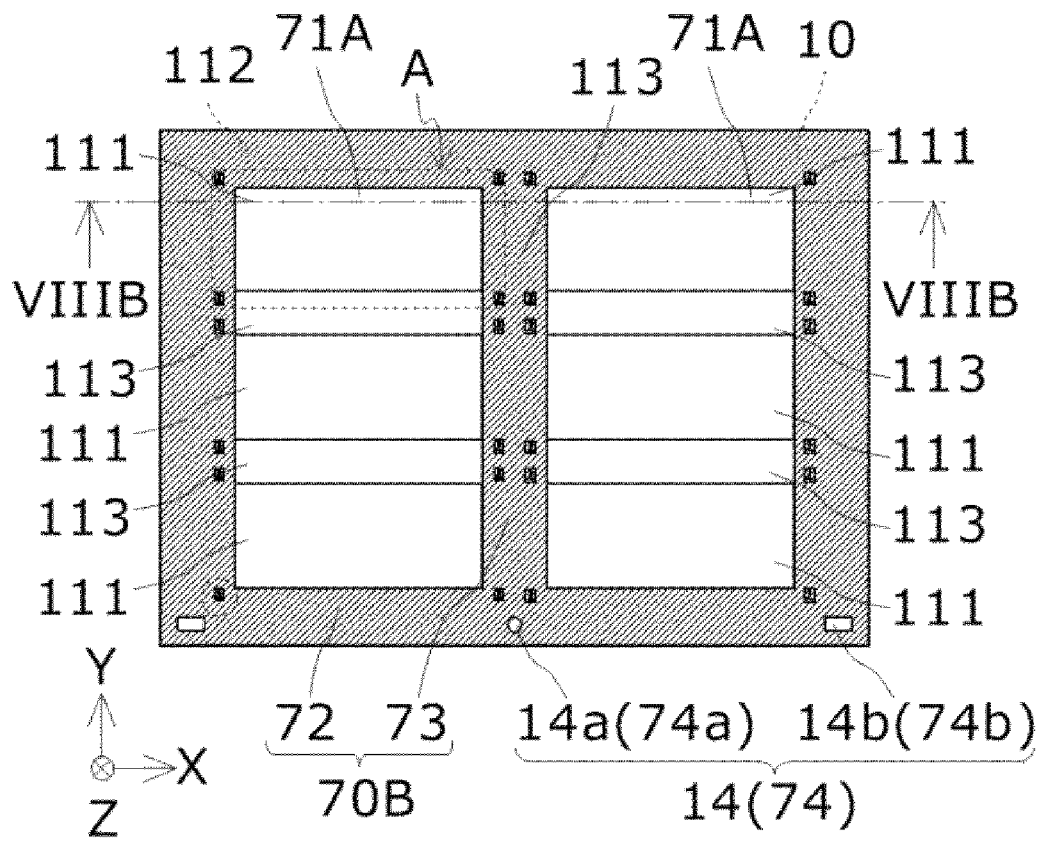
FIG. 8A is a schematic plan view showing the method for manufacturing a light emitting device of the embodiment.
Figure 8B:
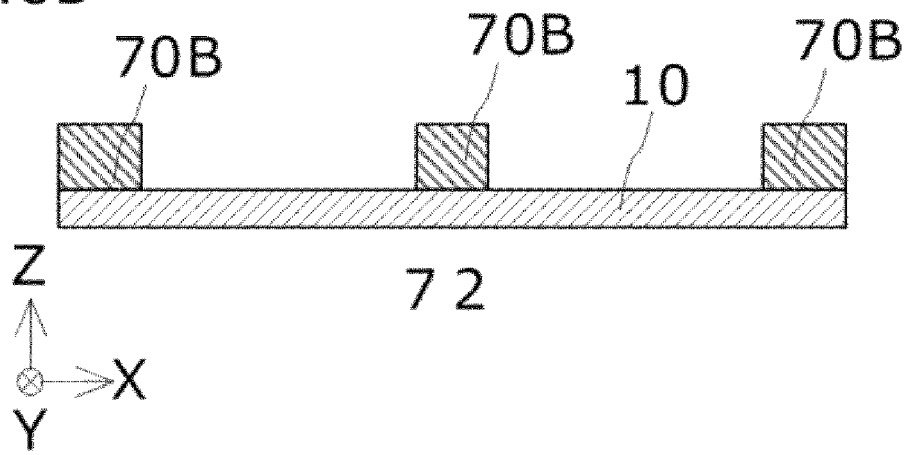
FIG. 8B is a schematic cross section view of line VIIIB-VIIIB of FIG. 8A.

A reinforcement member 70B shown in FIG. 8A and FIG. 8B show another example of a shape combining the reinforcement member 70 shown in FIG. 6A and FIG. 6B, and the reinforcement member 70A shown in FIG. 7A and FIG. 7B. In more detail, comprised are the reinforcement member placed on the frame shaped second region 112 surrounding the plurality of first regions 111 of the substrate 10, and the reinforcement member placed on the third region 113 positioned between the first regions 111 placed aligned side by side. Said another way, the reinforcement member 70B has a shape with which two frame shaped reinforcement members are linked placed on the second region 112 and the third region 113 of the substrate 10, and comprises two openings 71A. In this way, when the reinforcement member 70B comprises a plurality of the openings 71A, the part that surrounds all of the plurality of openings 71A is called a first reinforcement member 72 (outer frame part). Furthermore, the portion placed on the third region 113 of the substrate 10 is called a second reinforcement member 73 (inner frame part). The first reinforcement member 72 and the third reinforcement member 73 may be continuous as shown in FIG. 8A, or may be separated. By having the first reinforcement member 72 and the second reinforcement member 73 be continuous, it is possible to efficiently place them on the substrate 10, and possible to suppress warping of the substrate 10.

The reinforcement member 70B shown in FIG. 8A and FIG. 8B has three first regions 111 of the substrate 10 placed on each of the two openings 71A. Here, shown is an example of the two openings 71A placed aligned side by side, but the openings 71A may be placed aligned vertically, or may be placed aligned side by side and vertically. Also, the size of the plurality of openings 71A and the number of first regions 111 placed on the openings 71A can be selected as appropriate.

Figure 9A:
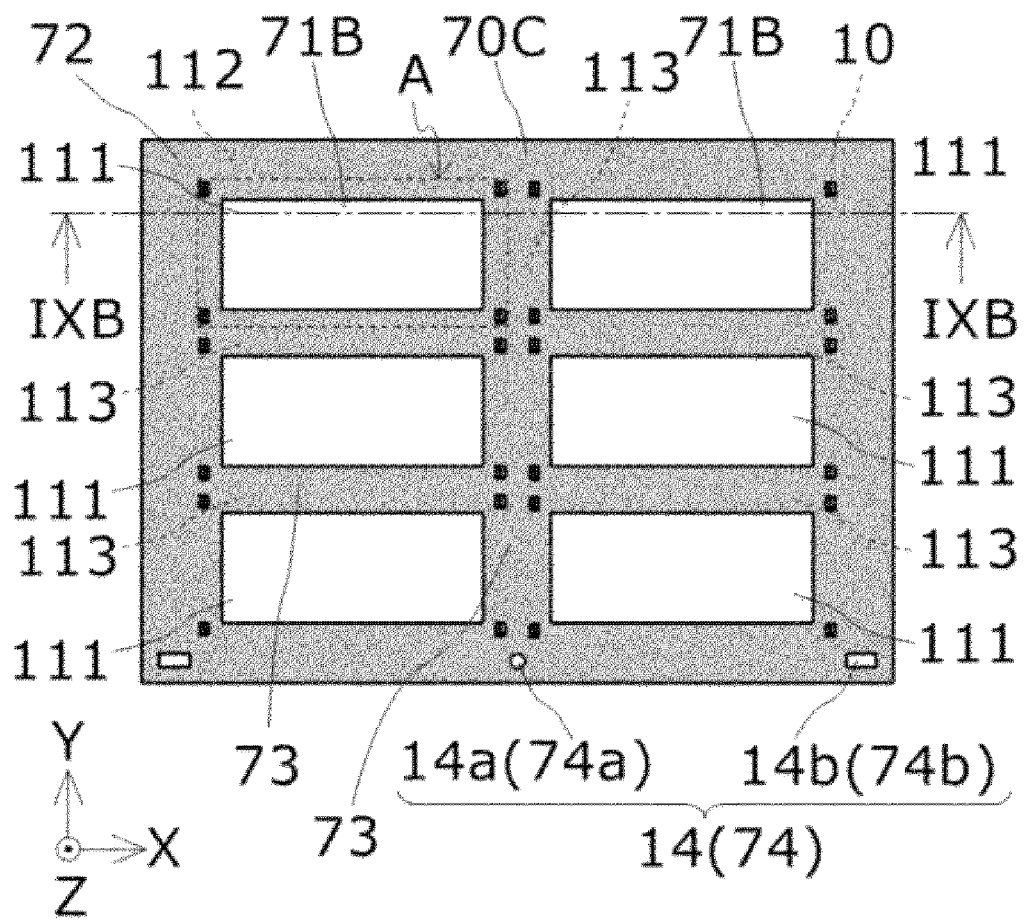
FIG. 9A is a cross section plan view showing a method for manufacturing a light emitting device of the embodiment.
Figure 9B:
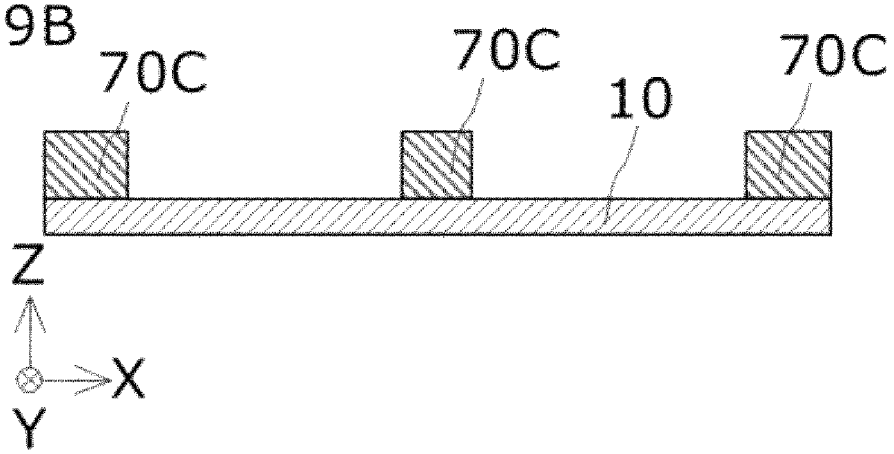
FIG. 9B is a schematic cross section view of line IXB-IXB of FIG. 9A.

Another example of a reinforcement member 70C shown in FIG. 9A and FIG. 9B comprises openings 71B corresponding to each of the first regions 111 of the substrate 10. Said another way, the number of openings 71B of the reinforcement member 70C is the same as the number of first regions 111 of the substrate 10. Here, the substrate 10 comprises six first regions 111, and the reinforcement member 70C comprises six openings 71B. In other words, the first reinforcement member 72 is placed on the entire periphery constituting the second region 112 of the substrate 10, and the second reinforcement member 73 is placed on all the third regions 113 of the substrate 10. In this way, the substrate 10 comprises a plurality of first regions 111, and by placing reinforcement members so as to surround each of those, it is possible to more effectively suppress deformation of the sealing member formed inside the first regions 111.

Figure 10A:
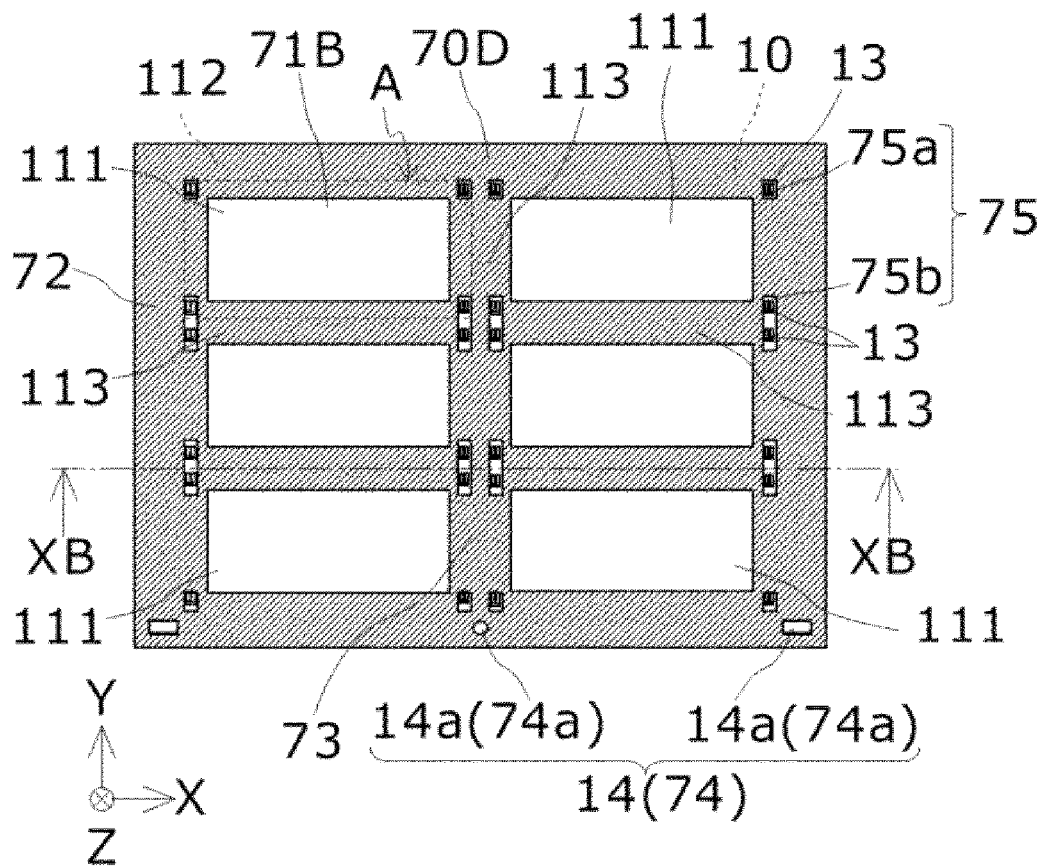
FIG. 10A is a schematic plan view showing the method for manufacturing a light emitting device of the embodiment.
Figure 10B:
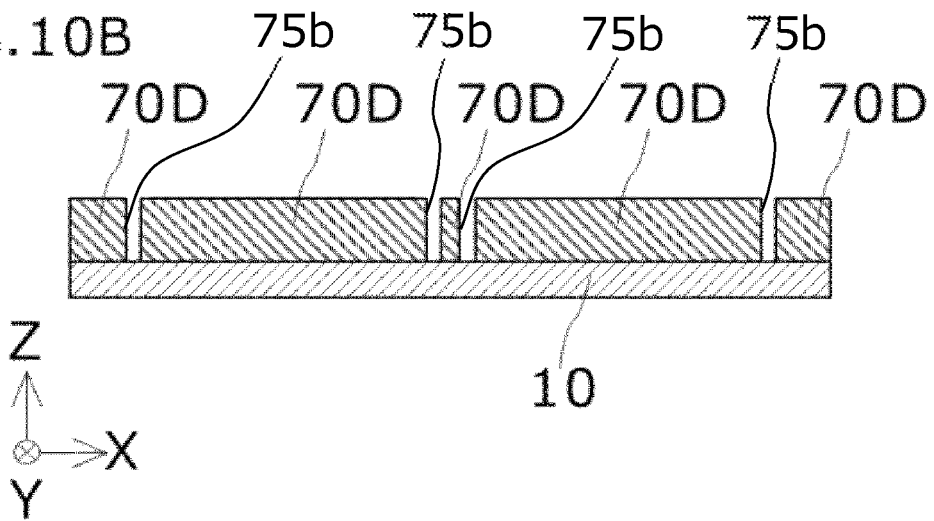
FIG. 10B is a schematic cross section view of line XB-XB of FIG. 10A.

Another example of a reinforcement member 70D shown in FIG. 10A comprises through holes 74 (74a, 74b) at positions corresponding to the through holes 14 (14a, 14b) of the substrate 10 of the reinforcement member 70C shown in FIG. 9A. Furthermore, through holes 75 (75a, 75b) for alignment mark recognition such as those in FIG. 10B are comprised at positions corresponding to the alignment marks 13.

The through holes 75 for alignment mark recognition may be one through hole 75 for one alignment mark 13, or may be one through hole 75 for two or more alignment marks 13. For example, with the example shown in FIG. 10, the through hole 75a has one alignment mark 13 visible, and the through hole 75b has two alignment marks 13 visible. By providing the through holes 75 for alignment mark recognition in this way, it is possible to have many choices for the material of the reinforcement member. The reinforcement members of the shapes such as those shown in FIG. 6A, FIG. 7A, and FIG. 8A may also have the through holes 74 and/or the through holes 75 for alignment mark recognition provided. This kind of through hole 75 can have a space or a light-transmissive member placed to be able to see the alignment mark 13.

Also, even when the reinforcement members shown in FIG. 6A, FIG. 7A, FIG. 8A and 9A do not have the through holes 75 for alignment mark recognition provided, but in such a case, by configuring the reinforcement member using a light-transmissive material, it is possible to recognize the alignment mark 13.

When the substrate 10 comprises through holes for positioning 14 (14a, 14b), as shown in FIG. 7A, FIG. 8A, FIG. 9A, and FIG. 10A, the reinforcement member may also comprise through holes for positioning 74 (74a, 74b) at positions corresponding to the through holes 14 of the substrate 10. The reinforcement member 70 shown in FIG. 6A is an example that does not comprise the through hole for positioning, but in such a case, by placing a positioning member for determining the position in the x direction and the y direction at the outer periphery of the reinforcement member 70, it is possible to do positioning of the substrate 10 and the reinforcement member.

The through holes 74 for positioning is preferably formed at a position that does not overlap with the alignment mark 13 of the substrate 10.

Sealing Member Forming Step

Figure 10C:
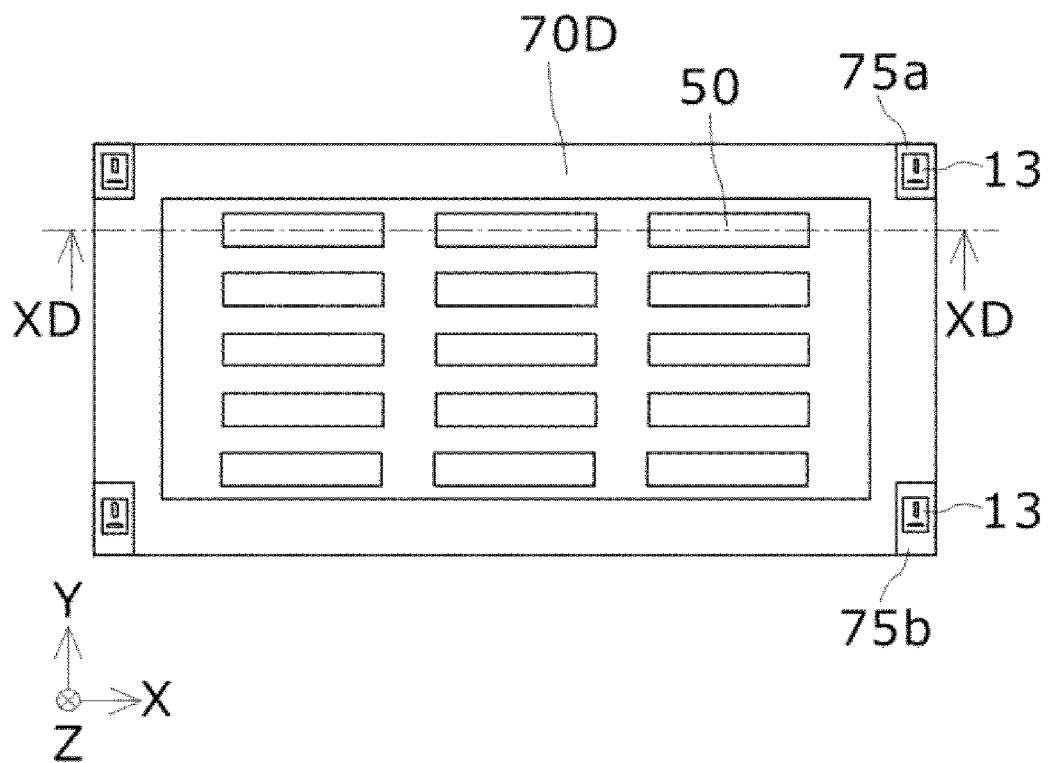
FIG. 10C is a schematic plan view showing an enlargement of a region A of FIG. 10A.
Figure 10D:
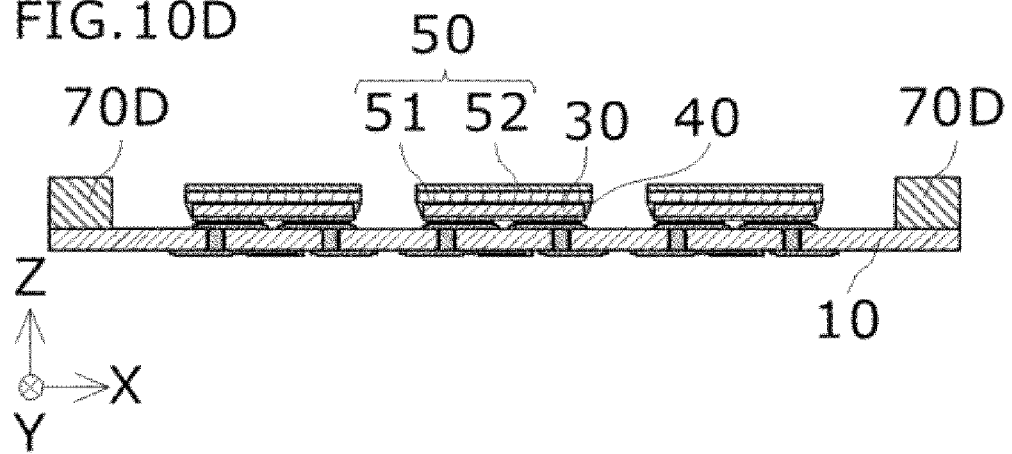
FIG. 10D is a schematic cross section view of line XD-XD of FIG. 10C.

FIG. 10C and FIG. 10D are enlarged views of a region A surrounded by dotted lines shown in FIG. 10A. In the step below, as the reinforcement member, an example of the reinforcement member 70D shown in FIG. 10A to FIG. 10D is shown.

The sealing member forming step is a step for placing the sealing member 60 that contains the resin material in contact with the reinforcement member 70D and the light emitting element 30 and curing that. Here, the sealing member 60 is formed so that the light guide member 40 placed at the side surface of the light emitting element 30 and the light-transmissive member 50 placed on the top surface of the light emitting element 30 are in contact. Furthermore, it is preferable that the sealing member 60 be formed so as to also contact the substrate 10. It is preferable that the sealing member 60 be formed at a height for which the top surface of the light-transmissive member 50 on the light emitting element 30 is covered.

Figure 11A:
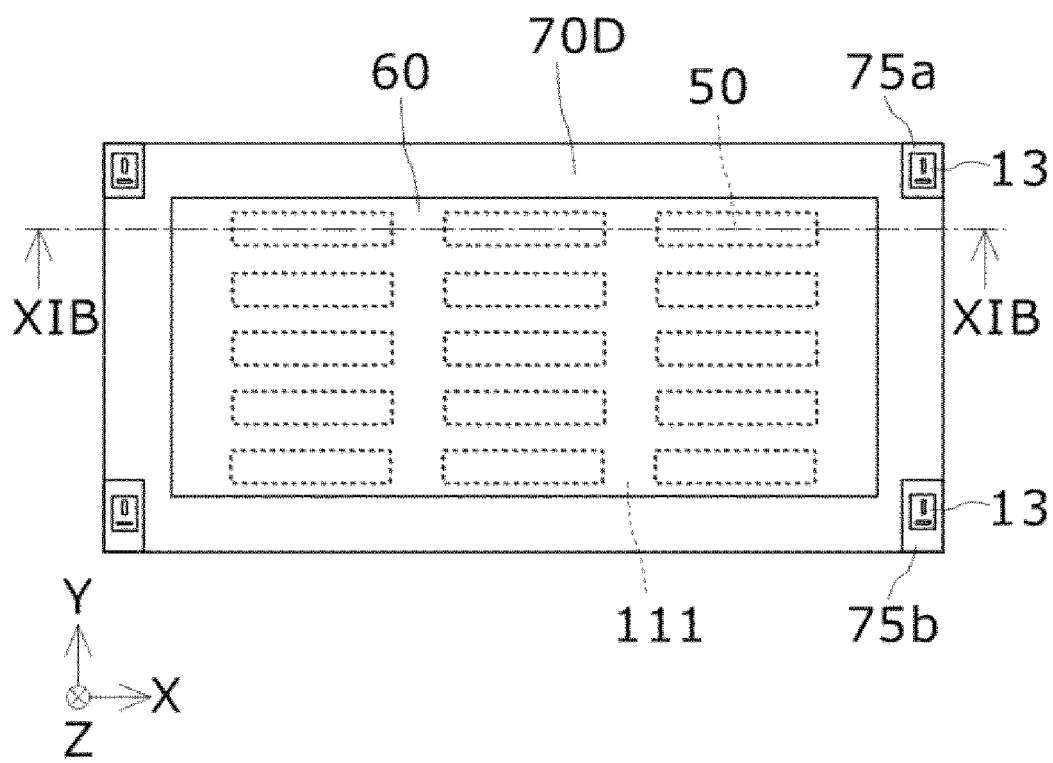
FIG. 11A is a schematic plan view showing the method for manufacturing a light emitting device of the embodiment.
Figure 11B:
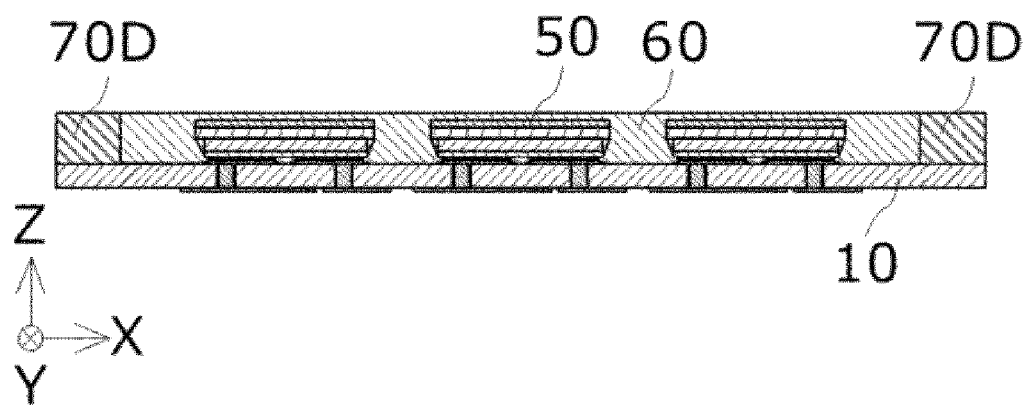
FIG. 11B is a schematic cross section view of line XIB-XIB of FIG. 11A.

With the examples shown in FIGS. 11A and 11B, the inside surface of the reinforcement member 70D and the sealing member 60 are in contact. Here, illustrated is an example in which the top surface of the reinforcement member 70D does not contact the sealing member 60 (the reinforcement member is not covered by the sealing member), but the invention is not limited to this, and it is also possible for the top surface of the reinforcement member to be in contact with the sealing member 60 (the reinforcement member may be covered by the sealing member), or for the outside surface of the reinforcement member 70D and the sealing member 60 to be in contact (the reinforcement member may be covered by the sealing member). When the substrate 10 comprises the third region 113, it is preferable that both the first reinforcement member placed on the second region 112 of the substrate 10 and the second reinforcement member placed on the third region 113 be in contact with the sealing member 60.

This sealing member forming step, for example, includes a step for forming the sealing member so as to not cover the top surface of the light-transmissive member 50, and curing this. Alternatively, it is also possible to include a step (step A) of forming the sealing member 60 at a height that covers the light-transmissive member 50 on the light emitting element 30 on the substrate 10 on which the reinforcement member is placed, and curing the sealing member 60, and a step (step B) for removing a portion of the cured sealing member 60 so as to expose the surface of the light-transmissive member 50. Hereafter, an example including step A and step B is explained.

Step A: Sealing Member Forming Step

With step A, as shown in FIG. 11A and FIG. 11B, the sealing member 60 is formed on the first region 111 on the substrate 10. The sealing member 60 is formed so as to contact the light emitting element 30, the light guide member 40, the light-transmissive member 50, and the reinforcement member 70D. The sealing member 60 is formed to cover the top surface of the light-transmissive member 50. As the method for forming the sealing member 60, for example, it is possible to use a method such as transfer molding, compression molding, potting, printing, etc.

Figure 12A:
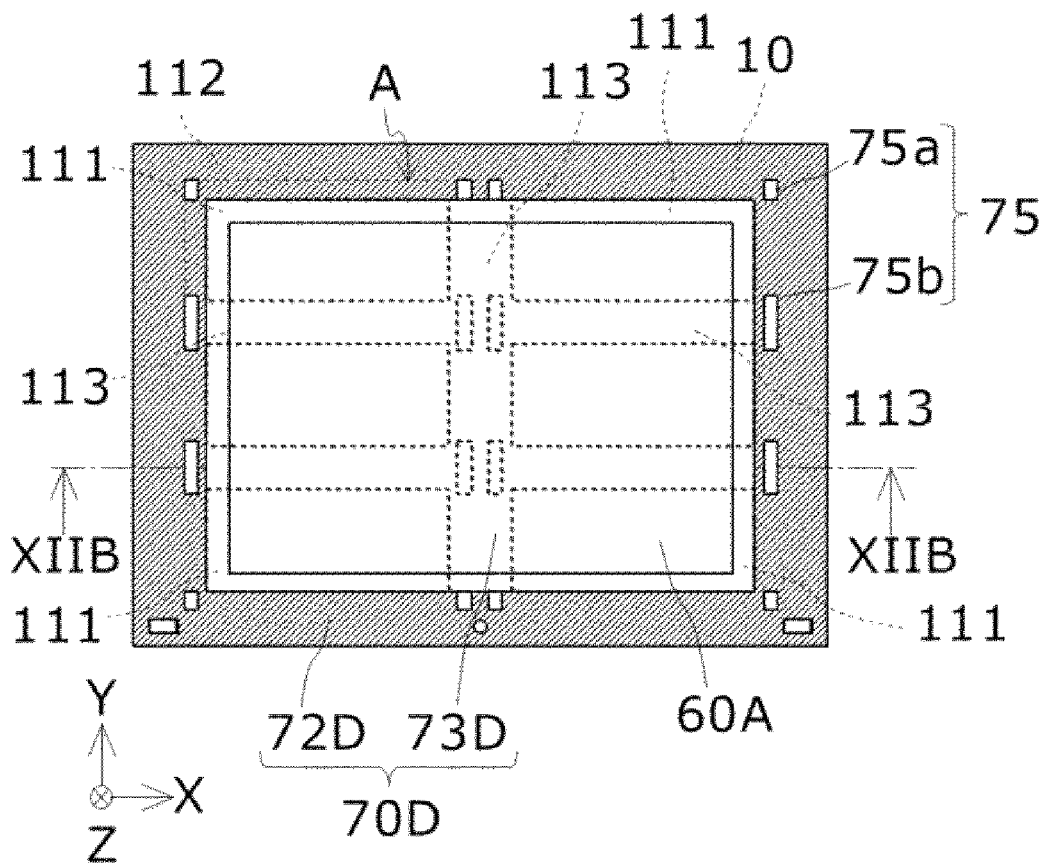
FIG. 12A is a schematic plan view showing the method for manufacturing a light emitting device of the embodiment.
Figure 12B:
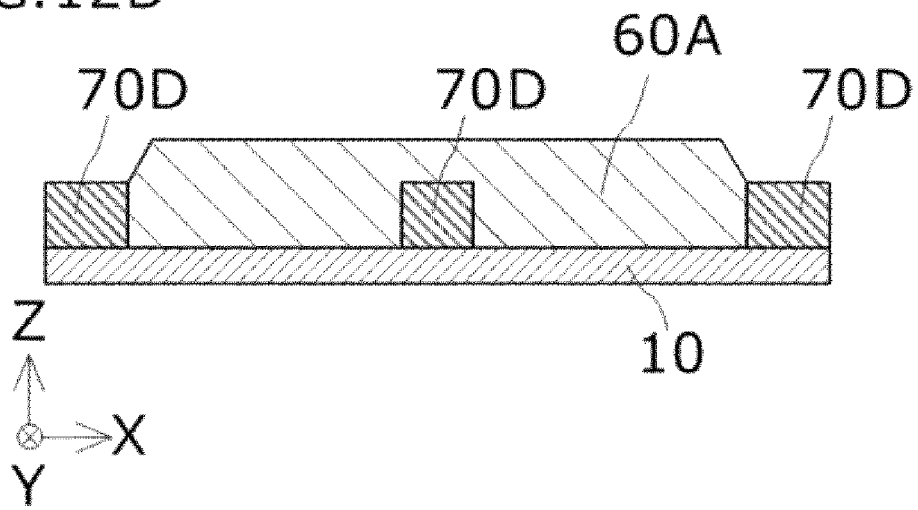
FIG. 12B is a schematic cross section view of line XIIB-XIIB of FIG. 12A.

With the example shown in FIG. 11B, the sealing member 60 is formed so as to have the same height as the reinforcement member 70D. However, the invention is not limited to this, and the sealing member 60 may also be formed at a height higher than the reinforcement member 70D. For example, with the example shown in FIG. 12A and FIG. 12B, a sealing member 60A is formed to be in contact with the inside surface of a first reinforcement member 72D placed on the second region 112 of the substrate 10, and to not be in contact with the top surface. Furthermore, the sealing member 60A is formed to be in contact with the inside surface and the top surface of a second reinforcement member 73D placed on the third region 113 of the substrate 10. In this way, it is possible to form the sealing member 60A to be in contact with a part or all of the reinforcement member 70D.

When forming the sealing member 60 using compression molding, in the through hole 14 of the substrate 10 on which the light emitting element 30, etc., is mounted and in the through hole 74 of the reinforcement member 70D, a positioning pin is inserted inside the metal mold of the compression molding machine, and the substrate 10 and the reinforcement member 70D are set in the compression molding machine in an overlapped state. After stirring the liquid sealing member 60 using a stirring device, it is filled in a syringe using a centrifugal defoaming filling machine. The liquid sealing member 60 filled in the syringe is supplied onto the substrate 10 on which the light emitting element 30, etc., is mounted and the reinforcement member 70D. Thereafter, the upper and lower metal molds are closed to sandwich the substrate 10, etc., and the sealing member 60 is cured. In the case of compression molding, the thickness of the sealing member 60 is determined by the amount of the sealing member 60 that is supplied.

When forming the sealing member 60 using transfer molding, in the through hole 14 of the substrate 10, and the through hole 74 of the reinforcement member 70D, the positioning pin is inserted inside the metal mold of a transfer molding machine, and the substrate 10 and the reinforcement member 70D are set in the transfer molding machine in an overlapped state. Preparing in the same manner as described above, the liquid sealing member 60 filled in the syringe is supplied to a plunger inside the metal mold. Thereafter, the upper and lower metal molds are closed to sandwich the substrate 10 and the reinforcement member 70D. The resin material is pressed and supplied using the plunger inside the space created between the metal mold and the substrate 10, and this is cured. In the case of transfer molding, the thickness of the sealing member 60 is determined based on the shape of the metal mold.

As the sealing member 60, it is possible to use a resin material that includes resin that is the base material, and a light reflective material. The material of the sealing member 60 is preferably a material for which the rigidity after curing is lower than that of the reinforcement member.

Also, the sealing member 60 is preferably a material for which the linear expansion coefficient after curing is close to that of the substrate 10. For example, it is preferable to be approximately ±100 ppm/° C. with respect to the linear expansion coefficient of the substrate 10. Also, the linear expansion coefficient of the sealing member 60, for example, is preferably approximately 120 ppm/° C. or less, and more preferably approximately 110 ppm/° C. or less. As the specific material of the resin, it is possible to use epoxy resin, silicone resin, etc. As a specific material of the light reflective material, examples include titanium oxide, silicon oxide, calcium carbonate, aluminum oxide, etc. As the content of the light reflective material, it is possible to use 10 weight % to 70 weight % with respect to the resin.

Step B: Sealing Member Removal Step

Figure 13A:
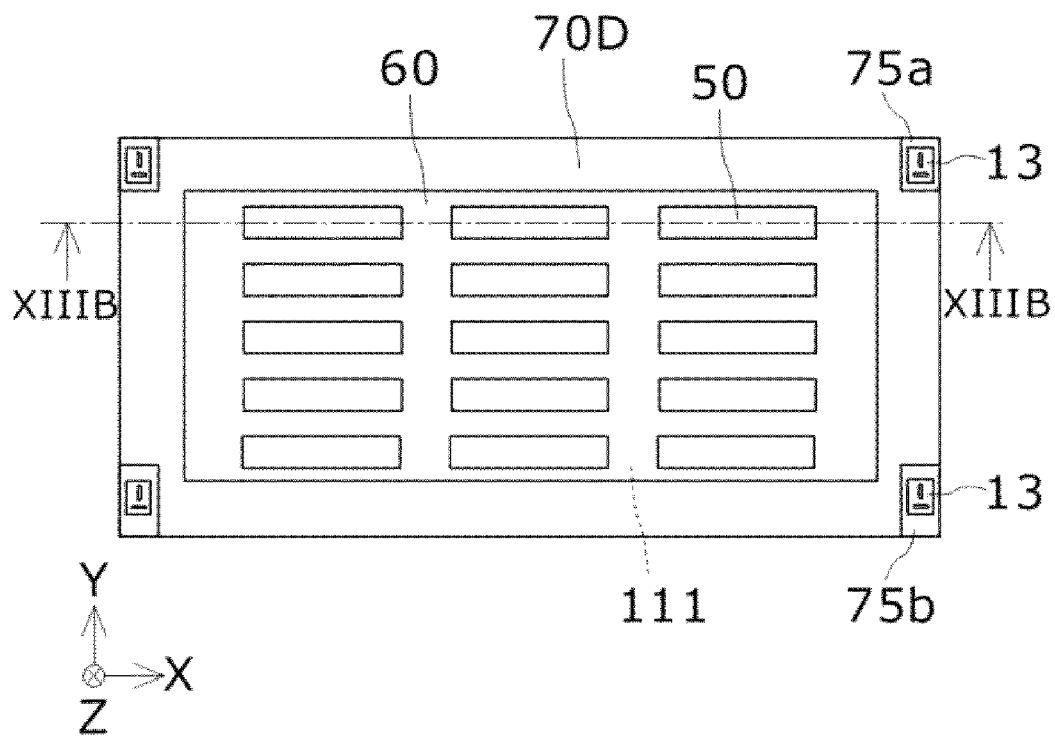
FIG. 13A is a schematic plan view showing the method for manufacturing a light emitting device of the embodiment.
Figure 13B:
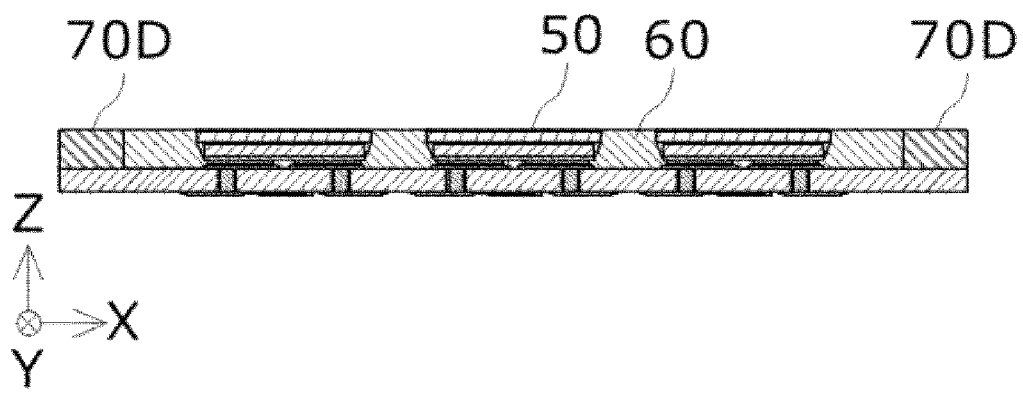
FIG. 13B is a schematic cross section view of line XIIIB-XIIIB of FIG. 13A.

As shown in FIG. 13A and FIG. 13B, with step B, the sealing member 60 above the light-transmissive member 50 is removed to expose the top surface of the light-transmissive member 50. For example, using grinding or blasting, etc., the sealing member 60 is removed from the top surface until the top surface of the light-transmissive member 50 (light emitting surface of the light emitting device) is exposed. When removing the sealing member 60, it is also possible to remove a portion of the light-transmissive member 50 at the same time. In such a case, the surface that is different from the top surface of the light-transmissive member 50 mounted with the previous step is the light emitting surface of the light emitting device.

Working as described above, the sealing member 60 that covers the side surface of the light emitting element 30 and the light-transmissive member 50 is formed. This step is a step in which the light-transmissive member 50 that is the light extraction surface is exposed, and the height of the light emitting device 100 is determined. With the manufacturing method of the present embodiment, by comprising the reinforcement member 70, it is possible to suppress deformation of the substrate 10 and the sealing member 60. For that reason, it is possible to have the removal amount of the sealing member 60 be constant, so it is possible to have the light emitting device 100 with variation in height suppressed.

Also, in step A described above, when forming the sealing member 60 so that at least a portion of the top surface of the light-transmissive member 50 is exposed, it is possible to omit step B. In such a case as well, by comprising the reinforcement member, warping of the substrate 10 is decreased, so it is possible to make the thickness of the light-transmissive member 50, etc., uniform.

Cutting Step

The cutting step is a step for cutting the sealing member 60 and the substrate 10 between the unit mounting regions 111u, and separating into individual light emitting devices 100.

Figure 14A:
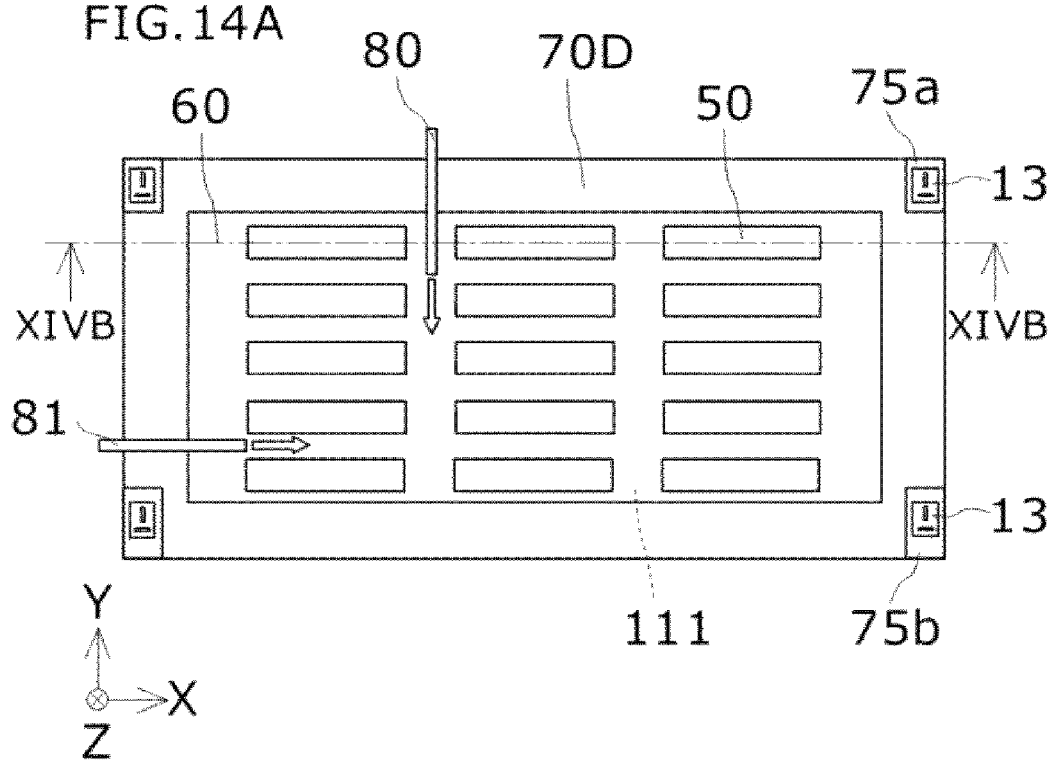
FIG. 14A is a schematic plan view showing the method for manufacturing a light emitting device of the embodiment.
Figure 14B:
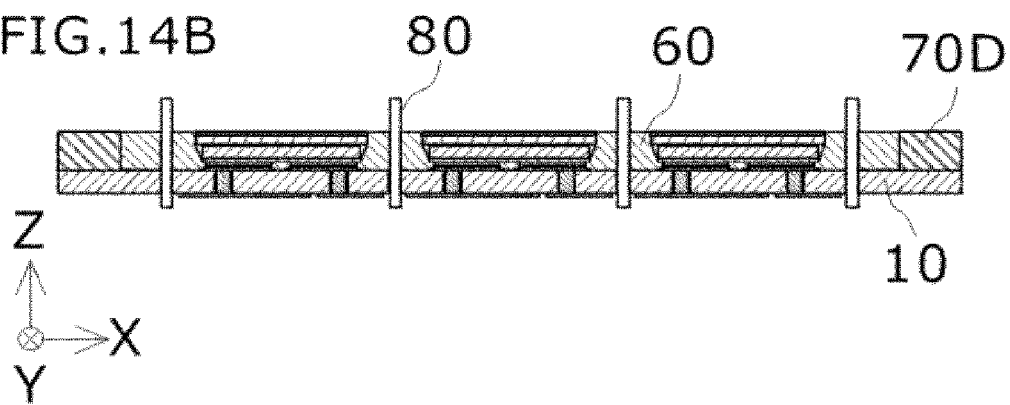
FIG. 14B is a schematic cross section view of line XIVB-XIVB of FIG. 14A.
Figure 14C:
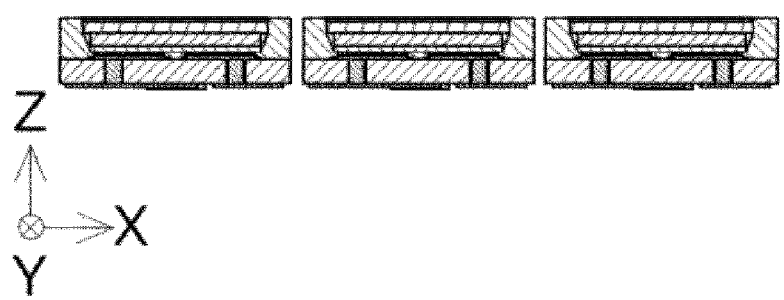
FIG. 14C is a schematic cross section view showing the method for manufacturing a light emitting device of the embodiment.

As shown in FIG. 14A and FIG. 14B, with the cutting step, the sealing member 60 and the substrate 10 between adjacent light emitting elements 30 are cut using blades 80 and 81. When cutting the substrate 10 and the sealing member 60, by comprising the reinforcement member 70D, deformation of the substrate 10 and the sealing member 60 is suppressed, so it is possible to cut at the desired cut position with precision. This makes it possible to suppress variation in the size of the light emitting device 100. In particular, it is easier to uniformly cut the width (thickness)

of the sealing member 60 formed on the side surface of the light-transmissive member 50 and the side surface of the light emitting element 30. This makes it possible to obtain diced light emitting devices 100 as shown in FIG. 14C.

This cutting step, for example, can be performed using a dicer. At this time, this may be performed without spraying water, or may be performed while spraying water. When the light-transmissive member 50 has the first light-transmissive member 51 that contains the wavelength conversion substance, it is preferable to cut without spraying water. This makes it possible to suppress deterioration even when the wavelength conversion substance contained in the first light-transmissive member 51 is a material with low moisture resistance. In this cutting step, the reinforcement member is also cut simultaneously.

With the method for manufacturing a light emitting device of the embodiment explained above, it is possible to form the sealing member 60 that covers the side surface of the light-transmissive member 50 and the side surface of the light emitting element 30 at a prescribed width with little variation in thickness. By doing this, for the side surface part of the light emitting element 30, it is not necessary to form the sealing member 60 at a thickness greater than necessary considering variation of the precision of the cutting position, making it possible to manufacture a small light emitting device.

Embodiment 1

Substrate Preparing Step

First, as the substrate preparing step, the substrate 10 for which the top view shape is a quadrangle like that shown in FIG. 2A is prepared. The substrate 10 comprises the base 11 which is the base material, and the electrically conductive member 12 for energizing the light emitting elements. The base 11 is substantially a flat plate shape of BT resin for which the length in the X direction is 90 mm, the length in the Y direction is 60 mm, and the thickness is 150 μm. The linear expansion coefficient of the base 11 is approximately 3 ppm/° C. The base 11 comprises the electrically conductive member 12 which has Cu as a main component. The electrically conductive member 12 comprises the first land electrode 121a and the second land electrode 122a of the top surface of the base 11, and the first terminal electrode 121d and the second terminal electrode 122d of the bottom surface of the base 11. Furthermore, the base 11 comprises a through hole of diameter 100 μm, and the interior thereof comprises the first connection electrode 121e and the second connection electrode 122e. In the through holes, epoxy resin is filled inside each of the first connection electrode 121e and the second connection electrode 122e.

The substrate 10 comprises six first regions 111, and a second region 112 surrounding those. Each first region 111 has a length in the X direction of 38 mm, and a length in the Y direction of 15 mm. The second region 112 is a frame shape surrounding the six first regions 111. A second region 16 extending in the X direction has a width in the X direction of 90 mm, and the second region 16 extending in the Y direction has a width in the X direction of 60 mm. Also, the substrate 10 comprises the third region 113 placed between adjacent first regions 111. The two third regions 113 extending in the X direction have a width in the X direction of 80 mm. The one third region 113 extending in the Y direction has a width in the Y direction of 49 mm.

Element Mounting Step

The light emitting element 30 is prepared. As the light emitting element 30, a nitride semiconductor ($In_xAl_yGa_{1-x-y}N$, $0 \leq X$, $0 \leq Y$, $X+Y \leq 1$) is used. The light emitting color of the light emitting element 30 is blue, and the peak wavelength is approximately 450 nm. The light emitting element 30 has a rectangular shape for the plan shape, the size is 1100 μm×200 μm, and the thickness is 120 μm.

Next, as a joining member, ball shaped AuSn (an AuSn ball) is placed on the first land electrode 121a and the second land electrode 122a of the first region 11 of the substrate 10. Also, the ball diameter is 126 μm. Furthermore, a temporary fixing material is placed on the AuSn ball.

The light emitting element 30 is mounted on the first land electrode 121a and the second land electrode 122a with the AuSn ball, etc., interposed, and is heated for 0.2 hours at 320° C. in a reflow oven. Also, by cooling, the first land electrode 121a and the second land electrode 122a are joined with the light emitting element 30 as shown in FIG. 3A and FIG. 3B.

Light-Transmissive Member Placing Step

Next, as shown in FIG. 4A and FIG. 4B, silicone resin is mounted as the light guide member 40 on the light emitting element 30. In more detail, the liquid light guide member 40 is placed on the light emitting element 30 using a pin transfer method.

Next, the light-transmissive member 50 is prepared. For the light-transmissive member 50, a cuboid shaped item of 1200 μm×240 μm×225 μm molded in advance is used. As shown in FIG. 5A and FIG. 5B, the light-transmissive member 50 is placed on the light guide member 40. In more detail, the light-transmissive member 50 is suctioned using a collet, and is placed on the light guide member 40 on the light emitting element 30. At that time, a portion of the light guide member 40 protruding from the joining surface of the light-transmissive member 50 and the light emitting element 30 covers the side surface of the light emitting element 30. Thereafter, this is heated at 170° C. using an oven, and the light guide member 40 is cured.

The light-transmissive member 50 is a light-transmissive resin material, and contains silicone resin as the base material. Here, this is a laminated structure light-transmissive member 50, and the upper side is the second light-transmissive member 52 that substantially does not contain the wavelength conversion substance, and the lower side is the first light-transmissive member 51 that does contain the wavelength conversion substance. As the wavelength conversion substance, contained are β sialon phosphor ($Si_{6-z}Al_zO_zN_{8-z}$: Eu (0<z<4.2)), and manganese activated potassium fluorosilicate phosphor (e.g. $K_2SiF_6$: Mn).

Next, a portion of the outer periphery of the light-transmissive member 50 undergoes dry grinding using a dicer. Thereafter, dry ice is sprayed on the side surface of the light-transmissive member 50 and the waste of the light-transmissive member 50 is removed.

Reinforcement Member Mounting Step

Next, the reinforcement member 70D for which the external shape is a quadrangle in the plan view like that shown in FIG. 9A and FIG. 9B is prepared. The reinforcement member 70D is substantially a plate shape of glass epoxy resin of X direction length 90 mm, Y direction length 60 mm, and thickness 450 μm. The linear expansion coefficient of the base 11 is approximately 3 ppm/° C.

The reinforcement member 70D comprises six openings 71B, and the first reinforcement member 72 that is an outer frame surrounding those. Each opening 71B has an X direction length of 38 mm, and a Y direction length of 15 mm. The first reinforcement member 72 is a frame shape that surrounds the six openings 71B. The first reinforcement member 72 extending in the X direction has an X direction width of 90 mm, and the first reinforcement member 72 extending in the Y direction has a Y direction width of 60 mm. Also, the reinforcement member 70D comprises the second reinforcement member 73 that is an inner frame placed between adjacent openings 71B. The two second reinforcement members 73 extending in the X direction have an X direction width of 80 mm. The one second reinforcement member 73 extending in the Y direction has a Y direction width of 49 mm.

This kind of reinforcement member 70D is overlapped with the substrate 10. As shown in FIG. 10A and FIG. 10C, the positions are matched so that it is possible to see the alignment marks 13 of the substrate 10 from the through holes 75 (75a, 75b) of the reinforcement member 70D.

Sealing Member Forming Step

Next, as shown in FIG. 11A and FIG. 11B, the sealing member 60 is formed on the substrate 10 on which the reinforcement member 70D is placed. At this time, so that the top surface of the light-transmissive member 50 placed on the light emitting element 30 of the first region 111 is buried, the sealing member 60 is formed at a height of approximately 0.5 mm. The sealing member 60 is formed using transfer molding. The sealing member 60 is a resin material containing 60 weight % of titanium oxide in silicone resin.

After curing the sealing member 60, as shown in FIG. 13A and FIG. 13B, a portion of the sealing member 60 is ground until a portion of the second light-transmissive member 52 is exposed.

Cutting Step

Finally, using blades 80 and 81, the substrate 10 and the sealing member 60 are cut, and separated into individual light emitting devices 100. In one first region 111, approximately 5000 light emitting devices 100 are obtained. The light emitting device 100 has a substantially cuboid outer shape as shown in FIG. 1, and as design values, has X direction length (width) 1.5 mm, Y direction length (depth) 0.3 mm, and Z direction length (height) 0.46 mm. With respect to this, 98% or greater of the obtained light emitting devices 100 are good articles of size within the standard.

What is claimed is:

1. A method for manufacturing a light emitting device, comprising:
   preparing a substrate having a first region and a second region surrounding the first region;
   mounting a plurality of light emitting elements in the first region;
   mounting a reinforcement member on the second region;
   forming and curing a sealing member in contact with the reinforcement member and with the light emitting elements, the sealing member having a lower rigidity than the reinforcement member; and
   cutting the substrate, the reinforcement member, and the sealing member to remove the reinforcement member and to separate into individual light emitting devices each including one or more of the light emitting elements, wherein
   the preparing of the substrate includes preparing the substrate having an additional first region, and a third region between the first region and the additional first region, and
   the mounting of the reinforcement member includes mounting the reinforcement member only on the third region and a part of the second region positioned at an extension of the third region.

2. The method for manufacturing a light emitting device according to claim 1, wherein
   the mounting of the reinforcement member includes mounting the reinforcement member including a first reinforcement member placed on the part of the second region of the substrate, and a second reinforcement member placed on the third region of the substrate.

3. The method for manufacturing a light emitting device according to claim 2, wherein
   the mounting of the reinforcement member includes mounting the first reinforcement member and the second reinforcement member to be continuous with each other.

4. The method for manufacturing a light emitting device according to claim 1, wherein
   the mounting of the reinforcement member includes mounting the reinforcement member so that a thickness of the reinforcement member is larger than a thickness of the substrate.

5. The method for manufacturing a light emitting device according to claim 1, wherein
   the mounting of the reinforcement member includes mounting the reinforcement member containing one of silicone resin, modified silicone resin, hybrid silicone resin, epoxy resin, glass epoxy, bismaleimide triazine, and polyimide.

6. The method for manufacturing a light emitting device according to claim 1, wherein
   the mounting of the reinforcement member includes mounting the reinforcement member containing one of copper and stainless steel.

7. The method for manufacturing a light emitting device according to claim 1, wherein
   the mounting of the reinforcement member includes mounting the reinforcement member containing a filler containing at least one of alumina, silica, titania, and aluminoborosilicate glass.

8. The method for manufacturing a light emitting device according to claim 1, wherein
   the mounting of the reinforcement member includes mounting the reinforcement member containing a filler with a blending amount of the filler being 1 weight % or greater and 80 weight % or less.

9. The method for manufacturing a light emitting device according to claim 1, wherein
   the forming and curing of the sealing member includes applying a light reflective resin member as the sealing member.

* * * * *